United States Patent
Chandra et al.

(10) Patent No.: US 11,026,321 B2
(45) Date of Patent: Jun. 1, 2021

(54) INFORMATION HANDLING SYSTEM COMPRISING A PROCESSOR COUPLED TO A BOARD AND INCLUDING A DIFFERENTIAL TRACE PAIR HAVING A FIRST STRAIGHT DIFFERENTIAL TRACE AND A SECOND SERPENTINE SHAPE DIFFERENTIAL TRACE

(71) Applicant: Dell Products L.P., Round Rock, TX (US)

(72) Inventors: Umesh Chandra, Santa Cruz, CA (US); Chun-Lin Liao, Taipei (TW); Bhyrav M. Mutnury, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 66 days.

(21) Appl. No.: 16/264,939

(22) Filed: Feb. 1, 2019

(65) Prior Publication Data

US 2020/0253036 A1   Aug. 6, 2020

(51) Int. Cl.
| | |
|---|---|
| *H05K 1/02* | (2006.01) |
| *H05K 1/11* | (2006.01) |
| *H05K 1/18* | (2006.01) |
| *H01P 3/02* | (2006.01) |
| *H05K 3/06* | (2006.01) |

(52) U.S. Cl.
CPC ........... *H05K 1/0248* (2013.01); *H01P 3/026* (2013.01); *H05K 1/0228* (2013.01); *H05K 1/0245* (2013.01); *H05K 1/112* (2013.01); *H05K 1/181* (2013.01); *H05K 3/06* (2013.01); *H05K 2201/09227* (2013.01); *H05K 2201/09236* (2013.01); *H05K 2201/09281* (2013.01); *H05K 2201/09727* (2013.01)

(58) Field of Classification Search
CPC ........ H01P 1/0248; H01P 1/0245; H01P 1/02; H01P 3/026; H01P 3/04; H01P 11/003; H05K 1/0248; H05K 1/0245; H05K 1/02
USPC ........................................................ 333/4, 5
See application file for complete search history.

(56) References Cited

U.S. PATENT DOCUMENTS

| | | | | |
|---|---|---|---|---|
| 9,690,895 | B2* | 6/2017 | Shen et al. | ............ H05K 1/0216 |
| 9,929,712 | B2* | 3/2018 | Fukuchi | .................. H01L 23/66 |
| 2015/0214596 | A1* | 7/2015 | Kawai | ..................... H01P 3/026 333/4 |

* cited by examiner

*Primary Examiner* — Benny T Lee
(74) *Attorney, Agent, or Firm* — Haynes and Boone, LLP

(57) ABSTRACT

A differential trace pair system includes a board including a board structure having a first, a second, a third, and a fourth board structure member, wherein a distance between the first and the third board structure members is longer than a distance between the second and the fourth board structure members. The differential trace pair system further includes a differential trace pair that includes a first differential trace extending between the first and the third board structure members and a second differential trace extending between the second and the fourth board structure members. The second differential trace having a serpentine structure that includes a first portion that continuously transitions away from the first differential trace and a second portion that is contiguous with the first portion, the second portion continuously transitions towards the first differential trace.

20 Claims, 15 Drawing Sheets

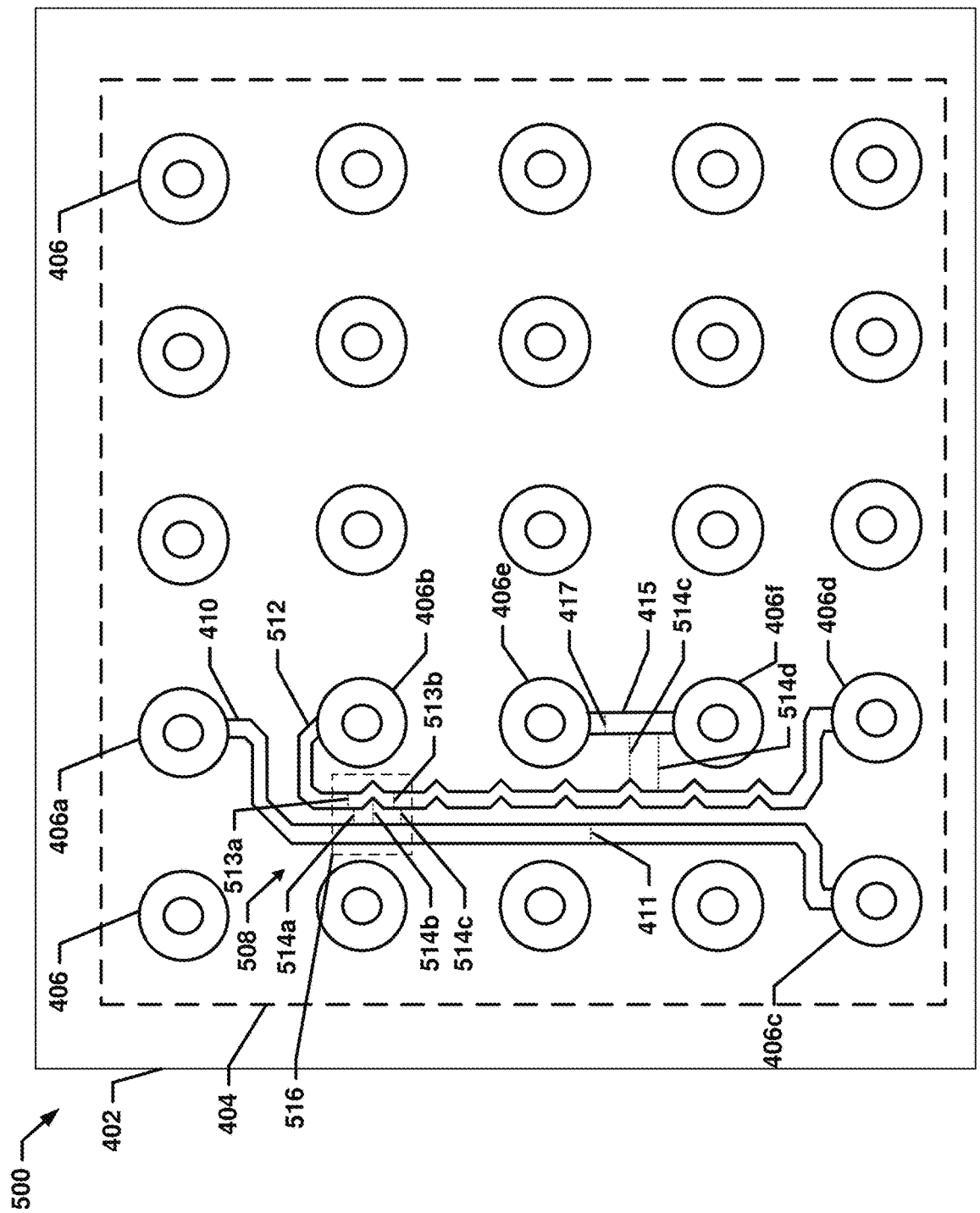

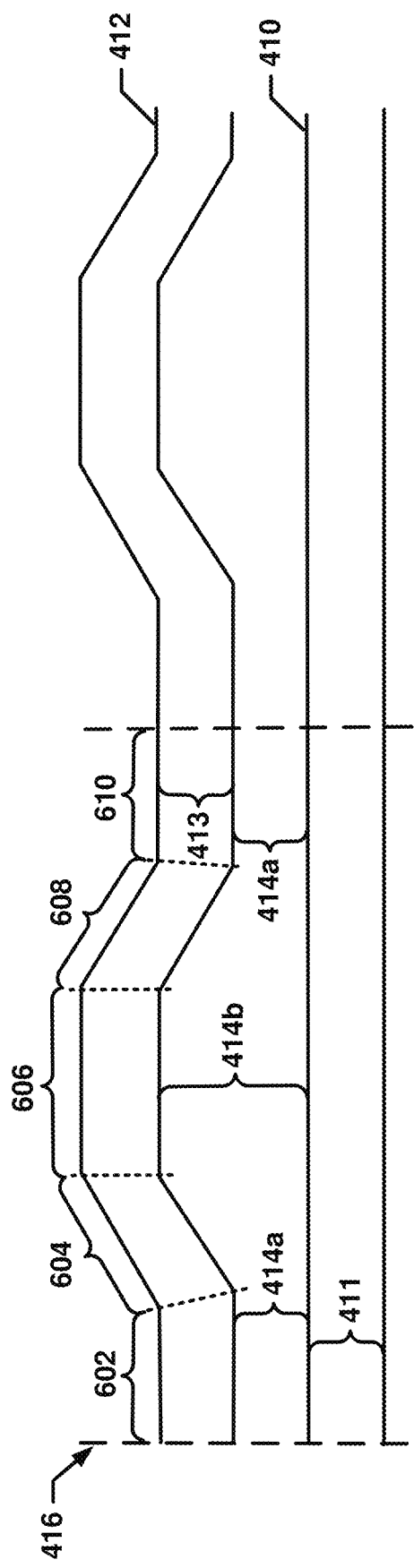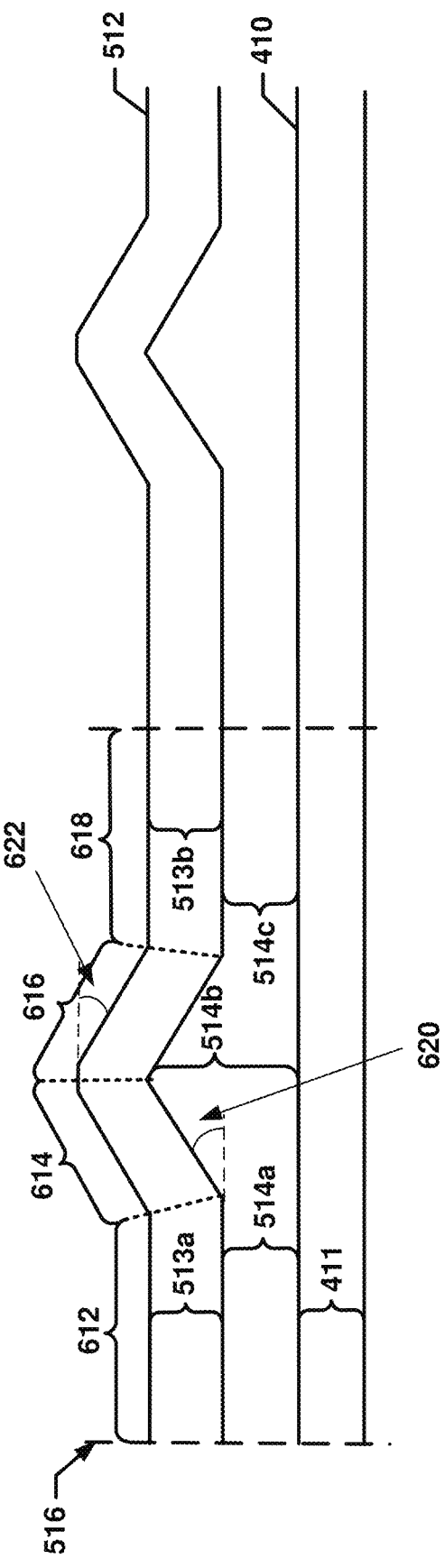

INFORMATION HANDLING SYSTEM COMPRISING A PROCESSOR COUPLED TO A BOARD AND INCLUDING A DIFFERENTIAL TRACE PAIR HAVING A FIRST STRAIGHT DIFFERENTIAL TRACE AND A SECOND SERPENTINE SHAPE DIFFERENTIAL TRACE

BACKGROUND

The present disclosure relates generally to information handling systems, and more particularly to high speed serial link intra pair skew correction in an information handling system.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems such as, for example, switches, servers, and/or other computing devices typically include circuit boards with communication traces that are connected to different subsystems in order to provide for the transmission of information between those subsystems. For example, a differential trace pair may be provided between a transmitter subsystem and a receiver subsystem in the switch or server (or between different switches and/or servers) in order allow those subsystems to transmit and receive information. In some situations, the differential trace pair may couple to the transmitter subsystem and/or the receiver subsystem at connectors such as, for example, a pin included in a pin field (e.g., a Ball Grid Array (BGA) pin field). The routing of differential trace pairs through such connectors can cause issues with the differential trace pair due to the connector arrangement, the placement of the differential trace pair, the angle of routing, and/or other differential trace pair routing characteristics known in the art. One of the common issues encountered in routing differential trace pairs in these and similar situations is when that routing results in one of the traces in the differential trace pair being longer than the other. This mismatch of trace length may cause common mode noise where a signal sent from the transmitter subsystem on the shorter trace in the differential trace pair arrives at the receiver subsystem before the signal that was sent from the transmitter subsystem on the longer trace in the differential trace pair. This problem is amplified as signal speeds increase beyond 25 Gbps, as the resulting common mode noise cannot be ignored, and issues associated with increased signal interferences, insertion, and return loss are introduced.

Conventional systems attempt to remedy this issue by flipping the polarity at the receiver subsystem end of the differential trace pair such that the shorter trace leaving the transmitter subsystem end of the differential trace pair becomes the longer trace entering the receiver subsystem end of the differential trace pair. However, such solutions result in common mode noise throughout the routing of the differential trace pair and are not possible on all system designs. Another conventional method for compensating for such differing trace length is to provide a serpentine region in the shorter trace that increases the length of the shorter trace to match that of the longer trace. The serpentine region length matching of the traces in the differential trace pair solves the common mode noise issue discussed above, but as signal speeds are increased to over 25 Gbps (e.g., 32 Gbps to 50/56 Gbps and beyond), the serpentine region length matching approach produces signal integrity issues. For example, when the shorter trace moves away from the longer trace in the serpentine region of the differential trace pair, an increase in impedance can occur (e.g., increases in impedance of 7-15 ohms have been observed depending on the stack-up cross-section and the material of the circuit board), resulting in high signal speed reflections and losses.

Accordingly, it would be desirable to provide an improved serpentine region in a differential trace pair.

SUMMARY OF THE INVENTION

According to one embodiment, an information handling system (IHS) includes a processor; a circuit board having a connection pad array that couples the processor to the circuit board, wherein the connection pad array includes a first connection pad, a second connection pad, a third connection pad, and a fourth connection pad, a differential trace pair that is provided in the circuit board and that includes: a first differential trace included on the board and extending between the first connection pad and the third connection pad, a second differential trace included on the board and extending between the second connection pad and the fourth connection pad. The second differential trace has a serpentine structure that includes a first section that is routed or formed so that the first section transitions away from the first differential trace. The serpentine structure of the second differential trace further includes a second section that is routed back toward the first differential trace substantially immediately after the first section has reached its greatest point or width of separation from the first differential trace.

BRIEF DESCRIPTION OF THE DRAWINGS

FIG. 5 is a schematic view illustrating an embodiment of a differential trace pair with a serpentine region that is routed through the board structure of FIGS. 3A and 3B.

FIG. 6A is a schematic view illustrating an embodiment of a serpentine region of the differential trace pair of FIG. 4.

FIG. 6B is a schematic view illustrating an embodiment of a serpentine region of the differential trace pair of FIG. 5.

In the figures, elements having the same designations have the same or similar functions and/or characteristics.

DETAILED DESCRIPTION OF THE INVENTION

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, Read Only Memory (ROM), and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Figure 1:
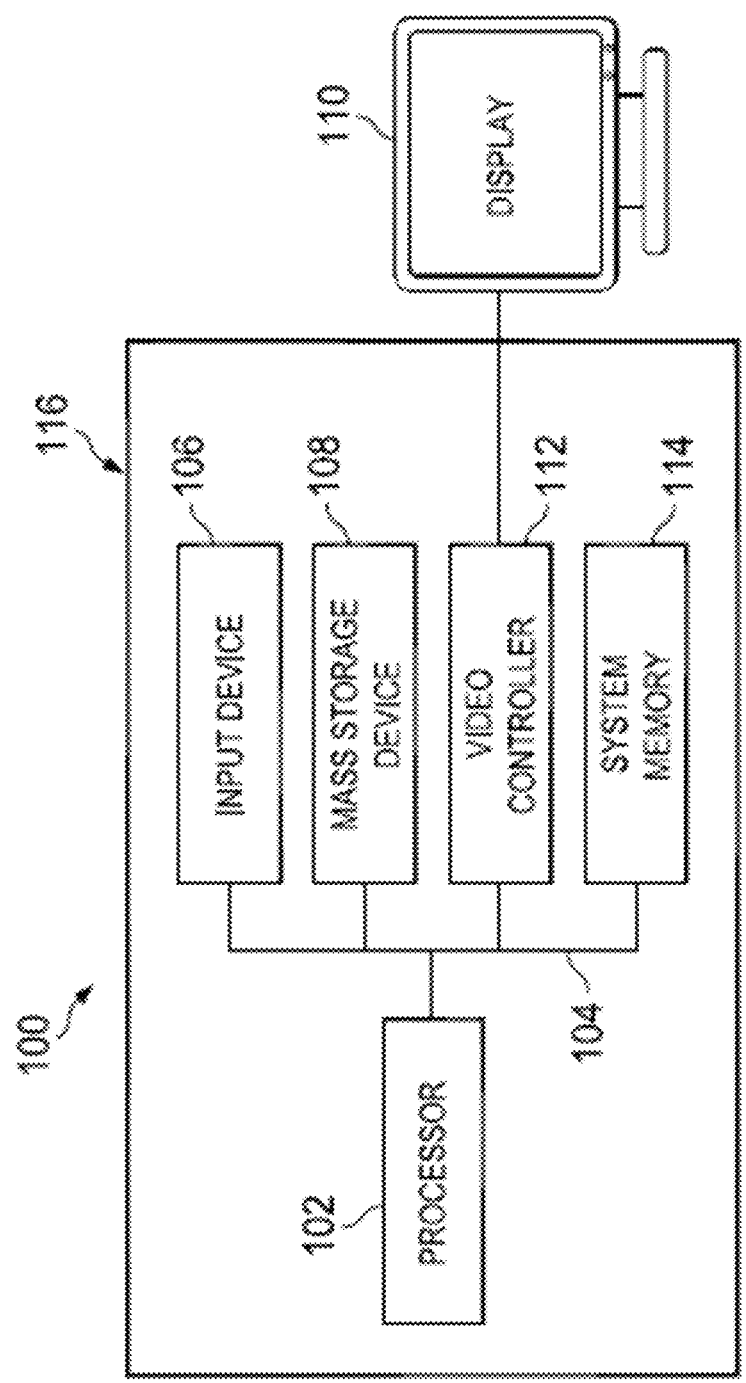
FIG. 1 is a schematic view illustrating an embodiment of an information handling system.

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or variety other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Figure 2:
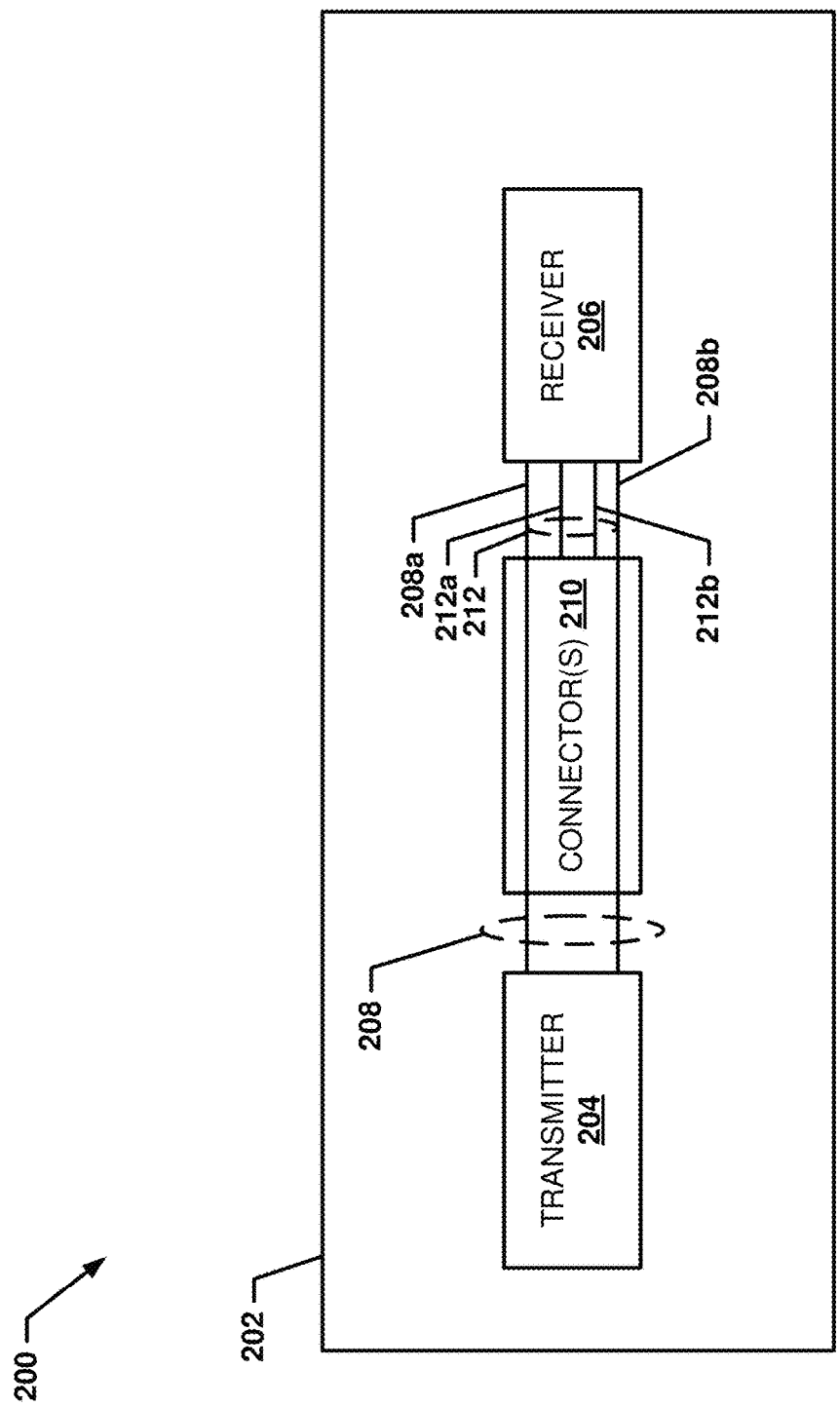
FIG. 2 is a schematic view illustrating a differential trace pair system.

Referring now to FIG. 2, an embodiment of a differential trace pair system 200 is illustrated. In an embodiment, the differential trace pair system 200 may be provided in the IHS 100 discussed above with reference to FIG. 1, and/or in one or more components of the IHS 100. In the illustrated embodiment, the differential trace pair system 200 includes a board 202 such as, for example, a circuit board that is provided to interconnect one or more components in the differential trace pair system 200. For example, a transmitter 204 and a receiver 206 may be mounted to the board 202 using a variety of couplings or connecters (e.g., surface mount technology (SMT) connectors and/or other connectors known in the art). In an embodiment, the transmitter 204 and/or the receiver 206 may be processing systems such as the processor 102 discussed above with reference to FIG. 1, communication systems, and/or other subsystems that communicate via differential trace pairs as is known in the art. A differential trace pair 208 that includes a first differential trace 208a and a second differential trace 208b is provided in the board 202 and extends through the board 202 between the transmitter 204 and the receiver 206. In an example, a differential trace pair 212 that includes a first differential trace 212a and a second differential trace 212b is provided in the board 202 and extends from the connector(s) 210 (e.g., surface mount technology (SMT) connectors and/or other connectors known in the art) to the receiver 206. In other examples, differential trace pairs may be routed to electrically couple connectors, to electrically couple couplings within transmitters, to electrically couple transmitters to connectors, to electrically couple couplings within receivers, and/or to couple any of a variety of other computing subsystems that would be apparent to one of skill in the art in possession of the present disclosure. One of skill in the art in possession of the present disclosure will recognize that the differential trace pair system 200 has been greatly simplified for clarity of discussion, and a board may include many more transmitters, receivers, and couplings/connectors that have been illustrated, with many more differential trace pairs that have been illustrated, while remaining within the scope of the present disclosure. Furthermore, a wide variety of other board and system features that have been omitted for clarity may be provided in the differential trace pair system 200 while remaining within the scope of the present disclosure.

Figure 3A:
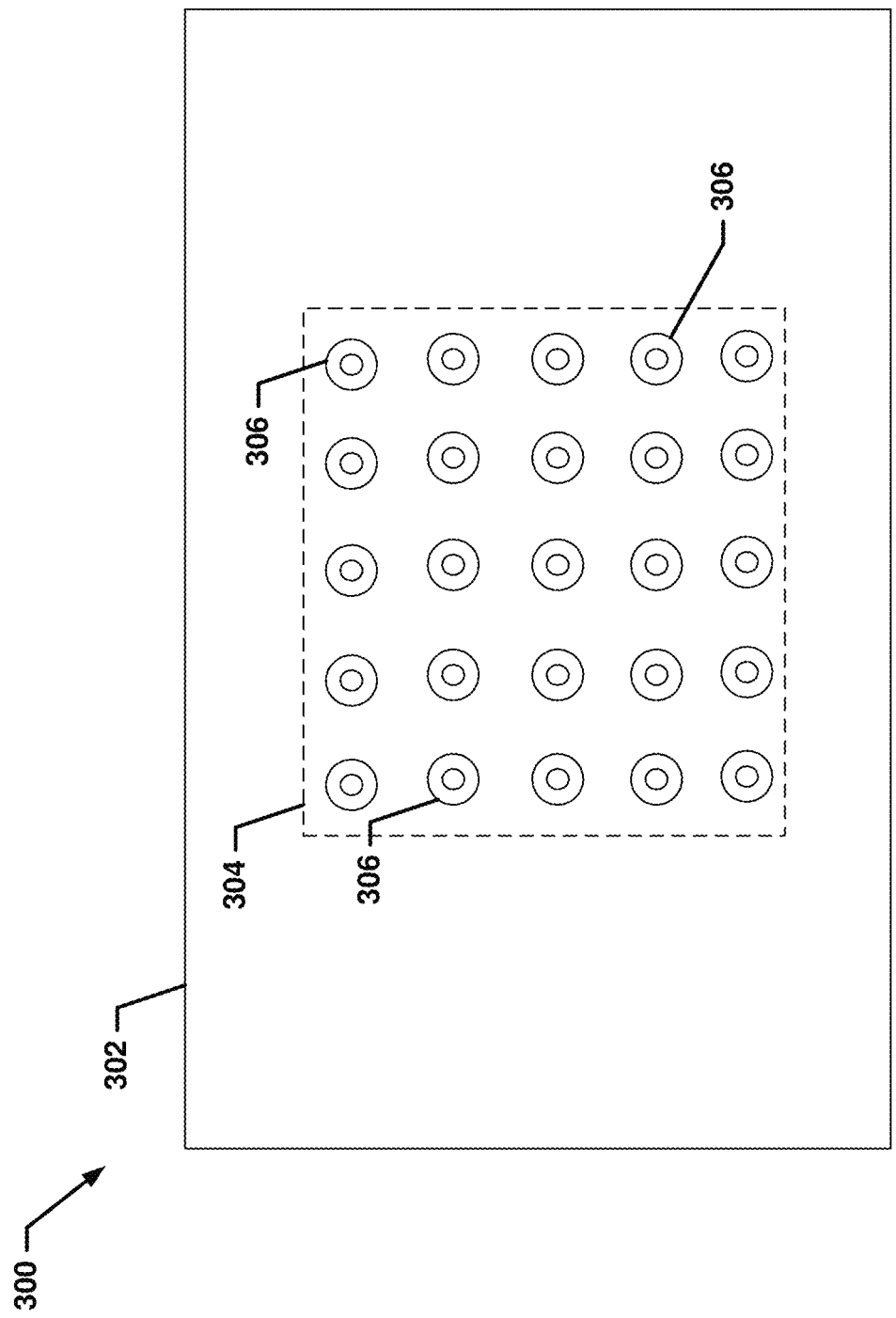
FIG. 3A is a schematic view illustrating an embodiment of a board structure in the differential trace pair system of FIG. 2.
Figure 3B:
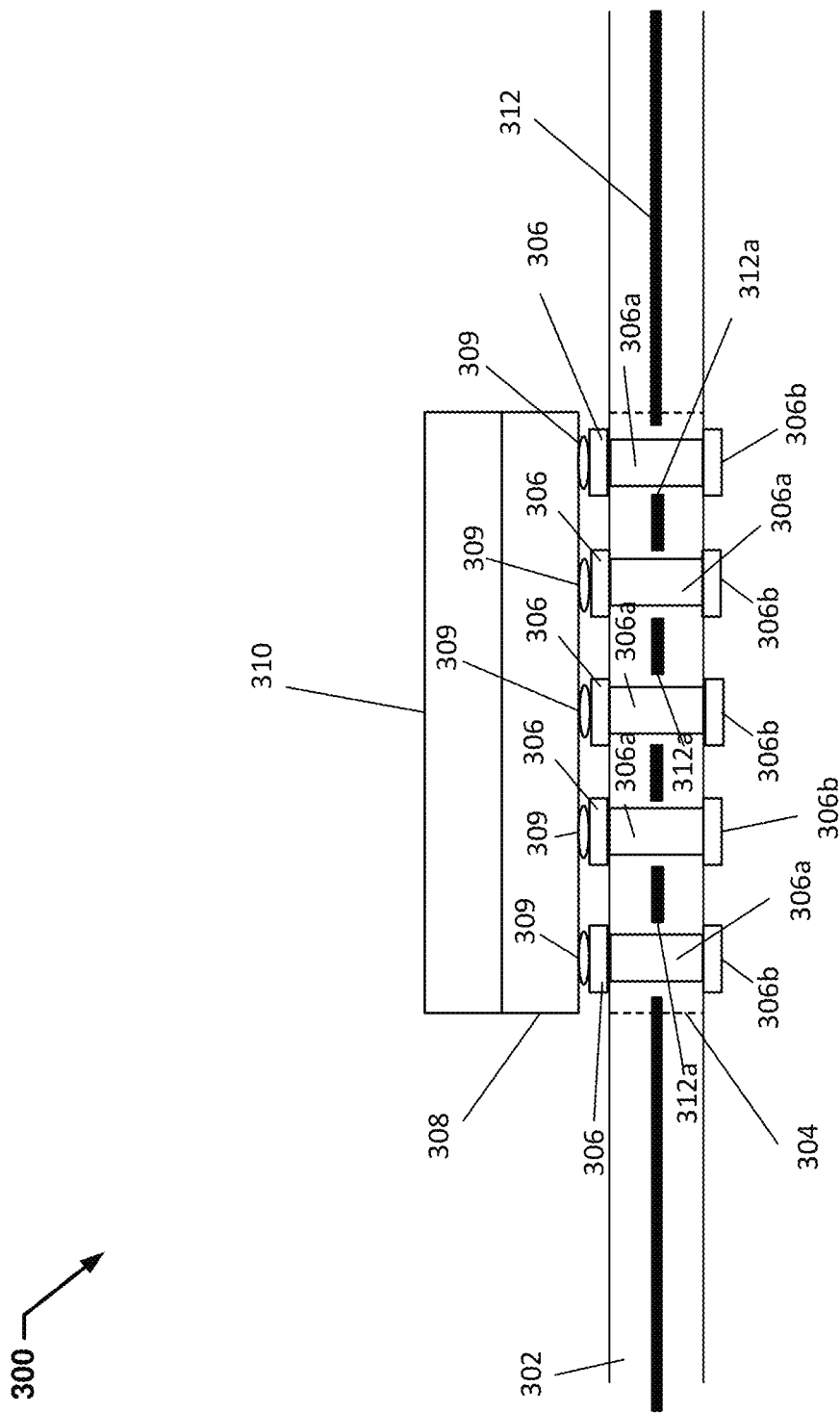
FIG. 3B is a schematic view illustrating an embodiment of the board structure of FIG. 3A coupled to a connector and a processing system.

Referring now to FIGS. 3A and 3B, an embodiment of a board structure 300 is illustrated. In the embodiments discussed herein, the board structure 300 is described as a connection pad array that may be used, for example, to couple or connect the transmitter 204, the receiver 206, and/or the connector(s) 210 to the board 202 in FIG. 2. However, in other embodiments, the board structure 300 may be other board structures such as, for example, system chassis structural members, non-conductive features or layers in the board, and/or a variety of other board structures known in the art. The board structure 300 includes a board 302, which may be the board 202 discussed above with reference to FIG. 2. A board structure area 304 is included on the board 302, and a plurality of board structure members 306 are provided in the board structure area 304. In the illustrated embodiment, the board structure 300 is a connection pad array and includes the board structure members 306 as connection pads that are provided in the board 302 in a symmetrical, spaced-apart array. However, in other embodiments, any orientation and/or positioning of board structure members is envisioned as falling within the scope of the present disclosure.

FIG. 3B illustrates a specific example of the board structure 300 as a connection pad array. As can be seen, each of the board structure members 306 (e.g., top connection pads in this embodiment) is coupled to a respective via 306a that is provided in the board 302 and that may be coupled and/or connected to one or more traces and/or other board features as is known in the art, as well as to a respective board structure members 306b (e.g., bottom connection pads in this embodiment). A connector 308 such as, for example, an SMT connector (e.g., a Ball Grid Array (BGA) connector in this embodiment) is mounted to the board structure members 306 using solder balls 309 and/or other methods known in the art. A system component 310 (e.g., a processing system in this embodiment) is mounted to the connector 308 and coupled through the connector 308 to the connection pads (e.g. board structure members 306), vias 306a, connection pads 306b, and/or other features in the board 302. As such, the system component 310 (e.g., a processing system) may be the transmitter 204 and/or receiver 206 of FIG. 2 and thus may transmit and/or receive data through the differential trace pair 208 as described in FIG. 2. However, in other embodiments, the board structure 300 may not couple to a connector and a system component (i.e., the board structure 300 may be non-communication structure that simply provides a trace-routing obstruction in the board 302) while remaining within the scope of the present disclosure. In the illustrated embodiment, an internal plane 312 is included in the board 302 and defines a plurality of anti-pads 312a adjacent each of the vias 306a.

Figure 4:
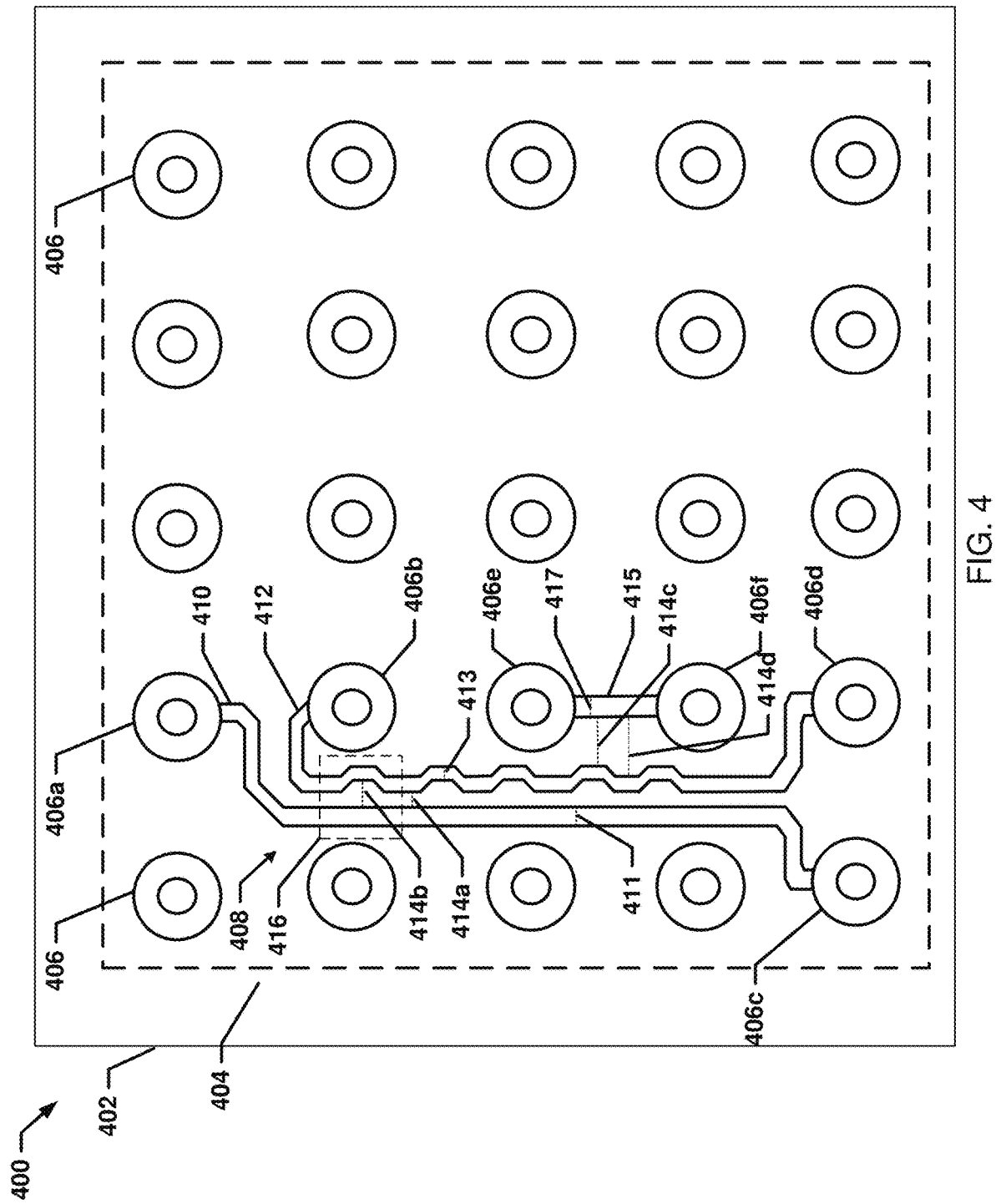
FIG. 4 is a schematic view illustrating an embodiment of a differential trace pair with a serpentine region provided by other techniques that is routed through the board structure of FIGS. 3A and 3B.

Referring now to FIG. 4, an embodiment of a differential trace pair with a serpentine region provided by other techniques is illustrated. The differential trace pair route 400 includes a board 402, which may be the board 202 discussed above with reference to FIG. 2 or the board 302 discussed above with reference to FIGS. 3A and 3B. The board 402 also includes a board structure 404 that may be the board structure 300 discussed above with reference to FIGS. 3A and 3B. The board structure 404 may include a plurality of board structure members 406, and in particular includes a first board structure member 406a, a second board structure member 406b, a third board structure member 406c, and a fourth board structure member 406d that are coupled together by a differential trace pair 408 provided in the board 402 in the examples discussed herein.

For example, the first board structure member 406a and the second board structure member 406b may be couplings/connectors for the transmitter 204 (FIG. 2), while the third board structure member 406c and the fourth board structure member 406d may be couplings/connectors for the receiver 206 (FIG. 2). The differential trace pair 408 includes a first differential trace 410 and extends between (e.g., electrically couples) the first board structure member 406a and the third board structure member 406c, and the differential trace pair 408 also includes a second differential trace 412 that extends between the second board structure member 406b and the fourth board structure member 406d. The board structure 404 may further include board structure members 406e and 406f that are coupled together by one or more adjacent traces such as an adjacent trace 415 with a width 417. In some examples, the second differential trace 412 and adjacent trace 415 may have multiple spacings 414c and 414d therebetween.

As further illustrated in FIG. 4, the distance between the first board structure member 406a and the third board structure member 406c is greater than the distance between the second board structure member 406b and the fourth board structure member 406d. Thus, if the differential trace pair 408 were to substantially maintain the first differential trace pair spacing 414a, the first differential trace 410 would be longer than the second differential trace 412, resulting in the common mode noise discussed above. Thereby, second differential trace 412 may be configured to include one more serpentine structures, such as serpentine structure 416, to compensate for the length mismatches between first differential trace 410 and second differential trace 412 as discussed in detail with reference to FIG. 6A. With the serpentine structure of second differential trace 412, the spacing between the first differential trace 410 and the second differential trace 412 in the differential trace pair 408 varies, such as, for example, shown with the first differential trace pair spacing 414a and the second differential trace pair spacing 414b.

Figure 7A:
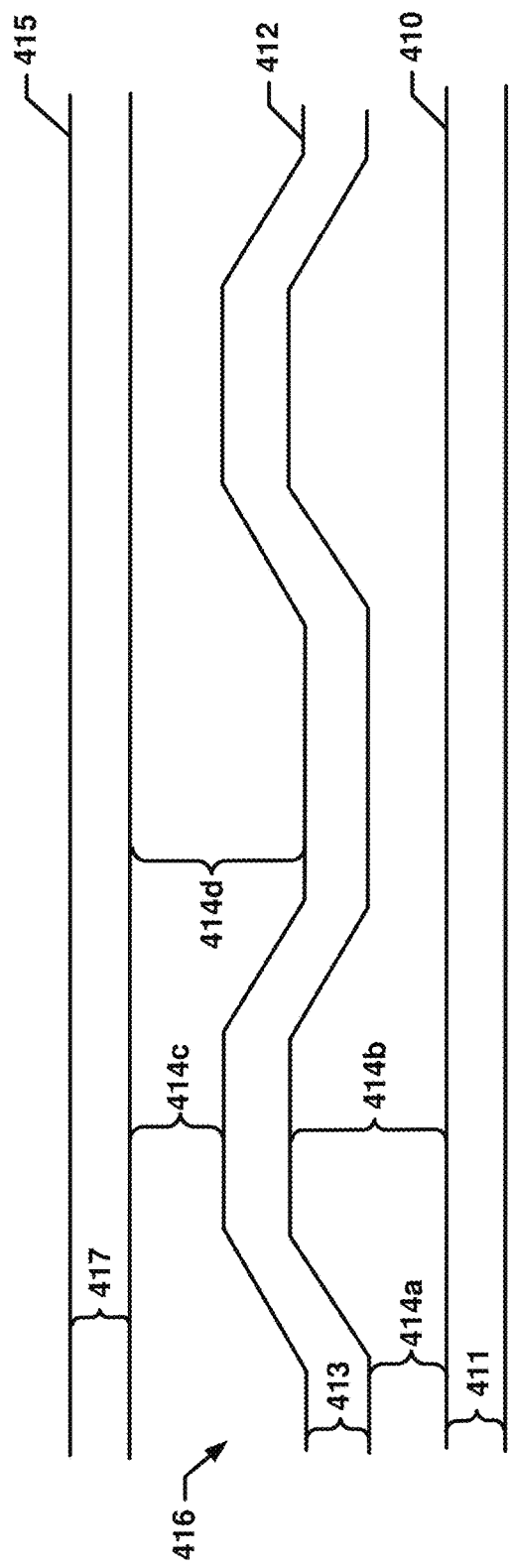
FIG. 7A is a schematic view illustrating an embodiment of a serpentine region of the differential trace pair of FIG. 4 and an adjacent trace.

FIGS. 6A and 7A are consistent with FIG. 4. Items with same reference numbers are substantially the same or have substantially the same functions and/or characteristics. Referring now to FIGS. 4, 6A, and 7A, an exemplary serpentine structure 416 comprises a first section 602 (FIG. 6A) of second differential trace 412 that is routed or formed substantially parallel alongside first differential trace 410 with a spacing 414a therebetween. A second section 604 (FIG. 6A) of second differential trace 412 is routed or formed so that the second section transitions away from first differential trace 410. As section 604 of second differential trace 412 transitions away from the first differential trace 410, the spacing or width between the first differential trace 410 and second differential trace 412 increases until first differential trace 410 and second differential trace 412 are separated by a spacing 414b. Serpentine structure 416 further comprises a third section 606 (FIG. 6A) of second differential trace 412 that is routed or formed substantially parallel alongside first differential trace 410, maintaining a relatively consistently spacing 414b apart from first differential trace 410. Serpentine structure 416 further comprises a fourth section 608 (FIG. 6A) of second differential trace 412 that is routed back toward first differential trace 410. As section 608 transitions back towards first differential trace 410, the spacing or width between the first differential trace 410 and second differential trace 412 decreases until first differential trace 410 and second differential trace 412 are separated by spacing 414a, for example, in a fifth section 610 of second differential trace 412. Second differential trace 412 and first differential trace 410 may have multiple segments where the spacings therebetween vary, similar to sections 602, 604, 606, 608, and 610 as discussed above. In some examples, spacing 414a between first section 602 of second differential trace 412 and first differential trace 410 is the smallest spacing between second differential trace 412 and first differential trace 410. In some examples, spacing 414b between third section 606 of second differential trace 412 and first differential trace 410 is the largest spacing between second differential trace 412 and first differential trace 410.

Each serpentine structure 416, with change or transition of second differential trace 412 away or towards first differential trace 410, adds length to second differential trace 412. Thereby, differential trace pair 408 (FIG. 4) may be configured to include a plurality of serpentine structures such as serpentine structure 416 such that the second differential trace 412 substantially have the same length as first differential trace 410.

As shown in FIGS. 4 and 7A, second differential trace 412 and adjacent trace 415 may also have multiple spacing in between. In some examples, spacing 414c between third section 606 of second differential trace 412 and adjacent trace 415 is the smallest spacing between second differential trace 412 and adjacent trace 415. While a specific differential trace pair has been illustrated and described, one of skill in the art in possession of the present disclosure will recognize that differential trace pairs may include a variety of different features (e.g., turns, different transitions, etc.).

One of skill in the art in possession of the present disclosure will recognize that differential trace pair 408 (FIG. 4) will produce an impedance between first differential trace 410 and second differential trace 412 as well as a crosstalk between second differential trace 412 and adjacent trace 415. In some examples, the impedance between first differential trace 410 and second differential trace 412 and a crosstalk between second differential trace 412 and adjacent trace 415 may depend, at least in part, on physical characteristics of first differential trace 410, second differential trace 412, and adjacent trace 415, such as, for example, materials, dimensions (e.g. widths of first differential trace 410, second differential trace 412, and adjacent trace 415, spacings between first differential trace 410 and second differential trace 412, spacings between second differential trace 412 and adjacent trace 415, thickness of first differential trace 410, second differential trace 412, adjacent trace 415, and/or the like). In some examples, the impedance between first differential trace 410 and second differential trace 412 and a crosstalk between second differential trace 412 and adjacent trace 415 may depend, at least in part, on data transmission speed of signals transmitted through first differential trace 410 and second differential trace 412 of differential trace pair 408 and/or the like. In some examples, the impedance between first differential trace 410 and second differential trace 412 and a crosstalk between second differential trace 412 and adjacent trace 415 may depend, at least in part, on a variety of other factors such as the dielectric constant of the differential traces, the loss dielectric materials of the differential traces, and/or the like.

In some examples, first differential trace 410 with first trace width 411 and second differential trace 412 with second trace width 413 having first differential trace pair spacing 414a may exhibit a first impedance at a particular data transmission speed (e.g., 25 Gbs, 32 Gbps, 50/56 Gbps). Meanwhile, first differential trace 410 with first trace width 411 and second differential trace 412 with second trace width 413 having second differential trace pair spacing 414b may exhibit a second impedance that is greater than the first impedance at that particular data transmission speed, thereby resulting in an impedance mismatch between first differential trace 410 and second differential trace 412. For example, in an experimental embodiment of differential trace pair 408 discussed herein with reference to FIGS. 4 and 6A, the first differential trace 410 and second differential trace 412 having a 4 mil width and first differential trace pair spacing 414a in between, produce a first impedance of 85 ohms, while differential trace pair 408 provided by the first differential trace 410 and second differential trace 412 having a 4 mil width and second differential trace pair spacing 414b in between, produce a second impedance of 95 ohms.

In some examples, routing adjacent trace 415 with width 417 within the range of electromagnetic radiation of second differential trace 412 with second trace width 413, results in a Signal Interference (SI) or a crosstalk between second differential trace 412 with second trace width 413. The crosstalk between second differential trace 412 and adjacent trace 415 depends on the spacing between second differential trace 412 and adjacent trace 415, widths of second differential trace 412 and adjacent trace 415, an amount of electromagnetic field radiated from second differential trace 412 and adjacent trace 415. The crosstalk between traces increases as the spacing between traces is decreased. In some examples, the crosstalk between second differential trace 412 and adjacent trace 415 with spacing 414c therebetween is more than the crosstalk between second differential trace 412 and adjacent trace 415 with spacing 414d therebetween.

The impedance mismatches between differential trace pairs in serpentine structure 416 and the crosstalk between second differential trace 412 and adjacent trace 415 can affect the quality of the transmitted signal. In some examples, the impedance mismatch between first differential trace 410 and second differential trace 412 transmitting data above 25 Gbps may result in reflection, return loss, insertion loss, and/or a variety of other issues that may result in degradation of a quality of the transmitted signal, such as, a Bit Error Rate (BER), a Signal to Noise Ratio (SNR), a phase noise, a jitter noise, a transmitted power, and/or the like. Thereby, methods and systems consistent with FIGS. 5, 6B, 7B, and 8 are provided to reduce the impedance mismatch between differential trace pairs in serpentine structure 416 and the crosstalk between second differential trace 412 and adjacent trace 415, as described in further detail herein with respect to FIGS. 10, 11, 12, 13A, and 13B.

Figure 7B:
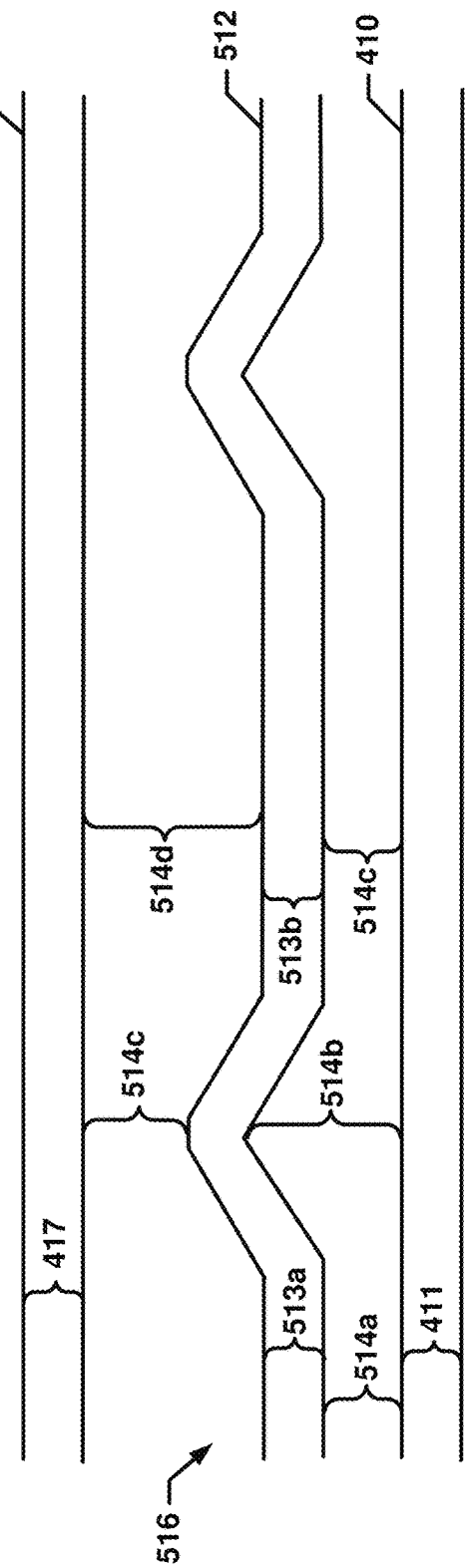
FIG. 7B is a schematic view illustrating an embodiment of a serpentine region of the differential trace pair of FIG. 5 and an adjacent trace.
Figure 8:
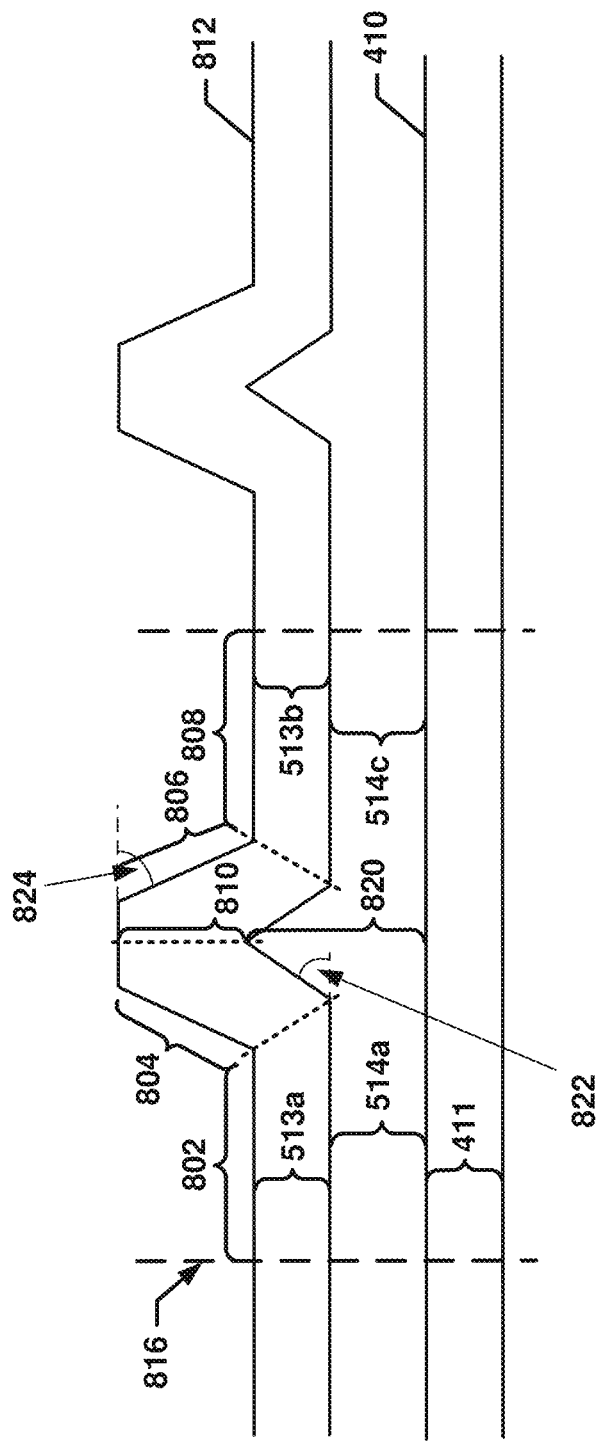
FIG. 8 is a schematic view illustrating an embodiment of a serpentine region of the differential trace pair of FIG. 5.

Referring now to FIG. 5, an embodiment of a differential trace pair with a serpentine region provided by using the systems and methods of the present disclosure is illustrated. In accordance with some embodiments, FIGS. 6B, 7B, and 8 are consistent with FIG. 5 with reference to FIG. 4. A differential trace pair route 500 includes a board structure 404 with a differential trace pair 508 in the examples discussed in detail in FIG. 6B, 7B. Differential trace pair 508 includes first differential trace 410, and a second differential trace 512 that extends between the second board structure member 406b and the fourth board structure member 406d. The board structure 404 may further include board structure members 406e and 406f that are coupled together by an adjacent trace 415 with a width 417. In some examples, the second differential trace 512 and adjacent trace 415 may have multiple spacings such as spacings 514c and 514d therebetween as illustrated in FIGS. 5 and 7B.

As further illustrated in FIG. 5, the distance between the first board structure member 406a and the third board structure member 406c is greater than the distance between the second board structure member 406b and the fourth board structure member 406d. Thus, if the differential trace pair 508 were to substantially maintain the first differential trace pair spacing 514a, the first differential trace 410 would be longer than the second differential trace 512, resulting in the common mode noise discussed above. Thus, according to some embodiments, second differential trace 512 may be configured to include one more serpentine structures, such as serpentine structure 516, to compensate for the length mismatches between first differential trace 410 and second differential trace 512 as discussed in detail in reference to FIG. 6B. With the serpentine structure of second differential trace 512, the spacing between the first differential trace 410 and the second differential trace 512 in the differential trace pair 508 varies, such as, for example, shown with first differential trace pair spacing 514a, second differential trace pair spacing 514b, and third differential trace pair spacing 514c. In some examples, spacing 514c may be the same as or different from spacing 514a.

According to some embodiments, second differential trace 512 may be configured to include one or more serpentine structures, such as serpentine structure 516, to reduce the crosstalk between second differential trace 512 and one or more adjacent traces such as adjacent trace 415 while compensating for the mismatch in distance between the board structure members connected by first differential trace 410 and second differential trace 512, respectively. In some examples, serpentine structure 516 may be used to reduce impedance mismatches between first differential trace 410 and second differential trace 512 compared to the impedance mismatches between first differential trace 410 and second differential trace 412 caused by serpentine structure 416 as discussed with respect to in FIGS. 4 and 6A. In some examples, serpentine structure 516 may be used to reduce the crosstalk between second differential trace 512 and adjacent trace 415 compared to the crosstalk between second differential trace 412 and adjacent trace 415 caused by serpentine structure 416 as discussed with reference to FIGS. 4 and 7B.

In some embodiments, the difference between spacings 514a and 514b in differential trace pair 508 may be decreased by routing the second differential trace 512 with a tapered transmission line as discussed in detail with respect to FIG. 8.

FIGS. 6B and 7B are consistent with FIG. 5. Referring to FIGS. 5, 6B, and 7B, a serpentine region with serpentine structure 516 comprises a first section 612 (FIG. 6B) of second differential trace 512 with a first width 513a that is routed or formed substantially parallel alongside first differential trace 410 with a spacing 514a therebetween. A second section 614 (FIG. 6B) of second differential trace 512 is routed or formed so that it transitions away from first differential trace 410 at a degree angle 620 (FIG. 6B). As section 614 of second differential trace 512 transitions away from the first differential trace 410, the spacing or width between the first differential trace 410 and second differential trace 512 increases until first differential trace 410 and second differential trace 512 are separated by a second spacing 514b.

In contrast to the serpentine region with serpentine structure 416 depicted in FIGS. 4, 6A, 7A, serpentine structure 516 of the present disclosure does not include a section of second differential trace 512 that runs or is formed parallel with the first differential trace 410, separated at the greater distance or second spacing 514b. Instead, serpentine structure 516 includes a third section 616 (FIG. 6B) of second differential trace 512 that is routed back toward first differential trace 410 substantially immediately after second section 614 has reached its greatest point or width of separation from the first differential trace 410. Third section 616 of second differential trace 512 that is routed back toward first differential trace 410 at a degree angle 622 (FIG. 6B). From that point, third section 616 is routed or formed to transition towards first differential trace 410 until first differential trace 410 and second differential trace 512 have a spacing 514c therebetween. In some examples, spacing 514c may be same as or different from spacing 514a. As such, second section 614 of second differential trace 512 that is transitioning away from first differential trace 410 and third section 616 of second differential trace 512 that is transitioning back to first differential trace 410, are continuous, contiguous or adjacent—connected without any intermediate sections that would maintain the second differential trace pair spacing 514b. Serpentine structure 516 further includes a fourth section 618 (FIG. 6B) of second differential trace 512 with a width 513b that is routed or formed alongside first differential trace 410 having spacing 514b therebetween. In some examples, width 513b may be the same as or different from width 513a. Second differential trace 512 and first differential trace 410 may have multiple segments where the spacings therebetween vary, similar to sections 612, 614, 616, and 618 as discussed with reference to FIG. 6B. In some examples, sections 612, 614, 616, and 618 may have same and/or different lengths.

According to some embodiments, multiple serpentine structures 516 may be formed in the differential trace pair. In some examples, spacing 514a between first section 612 of second differential trace 512 and first differential trace 410 is the smallest spacing between second differential trace 512 and first differential trace 410, which results in the smallest impedance between second differential trace 512 and first differential trace 410. In some examples, second spacing 514b between second differential trace 512 and first differential trace 410 is the largest spacing between second differential trace 512 and first differential trace 410, which results in the highest impedance between second differential trace 512 and first differential trace 410. As can be observed from FIG. 6B, the section of second differential trace 512 that is separated by the greatest width or largest spacing with respect to the first differential trace 410 is minimized; this reduces the impedance mismatch between second differential trace 512 and first differential trace 410. In some examples, in an experimental embodiment of differential trace pair 508 (FIG. 8) discussed herein with reference to FIGS. 5 and 6B, differential trace pair 508 provided by first spacing 514a produces a first impedance of 85 ohms, while differential trace pair 508 provided by second spacing 514b produces a second impedance of 90 ohms.

Each change or transition between the first differential trace pair spacing 514a and differential trace pair spacing 514b adds length to second differential trace 512. Thereby, differential trace pair 508 may be configured to include a plurality of serpentine structures such as serpentine structure 516 such that the second differential trace 512 substantially have the same length as first differential trace 410. In some examples, the plurality of serpentine structures may be formed differently and have different dimensions and characteristics to compensate for different impedance mismatches in different regions or areas alongside between first differential trace 410 and second differential trace 512.

According to some embodiments, with reference to FIG. 6B, the length of each section of serpentine structure 516 may be calculated to eliminate, reduce, or otherwise minimize impedance discontinuities, signal interference caused by differential trace pair structures with serpentine structures similar to serpentine structure 416. In some examples, degree angle 620 of second differential trace 512 transitioning away from and degree angle 622 transitioning back to first differential trace 410 may be calculated to reduce impedance mismatch between first differential trace 410 and second differential trace 512 as well as a crosstalk between second differential trace 512 and adjacent trace 415 (FIG. 5). In some examples, the transition point from second section 614 (FIG. 6B) to third section 616 of second differential trace 512 may be configured to have a soft turn and/or bending structure to avoid data transmission distortion due to sharp angle change from second section 614 to third section 616 (FIG. 6B) in second differential trace 512. In some examples, the length of second section 614 and third section 616 may be calculated to minimize impedance mismatch between first differential trace 410 and second differential trace 512 as well as a crosstalk between second differential trace 512 and adjacent trace 415, while adding pre-determined length to second differential trace 512. In some examples, the length of second section 614 and third section 616 in each serpentine structure 516 may be based on the total length difference between first differential trace 410 and second differential trace 512, the speed of data transmission, and/or the like.

As shown in FIGS. 5 and 7B, second differential trace 512 and adjacent trace 415 may have multiple spacings in between. In some examples, spacing 514c between second differential trace 512 and adjacent trace 415 is the smallest spacing between second differential trace 512 and adjacent trace 415. While a specific differential trace pair has been illustrated and described, one of skill in the art in possession of the present disclosure will recognize that differential trace pairs may include a variety of different features (e.g., turns, different transitions, etc.) while remaining within the scope of the present disclosure.

As shown in FIGS. 5 and 6B, the difference between spacings 514a and 514b in differential trace pair 508 (FIG. 5) may be decreased or reduced by using one or more tapered portions with reference to second differential trace 812 as discussed in detail with respect to FIG. 8.

Referring now to FIG. 8, another embodiment of differential trace pair route 500 (FIG. 5) with serpentine structure 816 is illustrated. As shown in FIG. 8, second section 804 of second differential trace 812 is tapered to gradually increase the width of second differential trace 812, thereby reducing the longest spacing between first differential trace 410 and second differential trace 812. Second section 804 of second differential trace 812 transitions away from first differential trace 410 at a degree angle 822. Serpentine structure 816 further includes a third section 806 of second differential trace 812 that is contiguous or adjacent-connected to section 804. Third section 806 is routed or formed to transition towards first differential trace 410. As third section 806 transitions, the width of second differential trace 812 is decreased to width 513b. Third section 806 of second differential trace 812 transitions towards first differential trace 410 at a degree angle 824. First differential trace 410 and second differential trace 812 have a spacing 514c therebetween. In some examples, width 513b may be the same as or different from width 513a. Serpentine structure 816 further includes a fourth section 808 of second differential trace 812 with width 513b. Section 808 is routed or formed alongside first differential trace 410 maintaining spacing 514c therebetween.

Each change or transition between the first differential trace pair spacing 514a and differential trace pair spacing 820 (FIG. 8) adds length to second differential trace 812. Thereby, differential trace pair 508 (FIG. 5) may be configured to include a plurality of serpentine structures such as serpentine structure 816 such that the second differential trace 812 substantially have the same length as first differential trace 410. In some examples, the plurality of serpentine structures may be formed differently and have different dimensions and characteristics to compensate for different impedance mismatches in different regions or areas alongside between first differential trace 410 and second differential trace 812. In some examples, spacing 514c may be the same as or different from spacing 514a. In some examples, sections 802, 804, 806, and 808 of FIG. 8 may have same and/or different lengths.

According to some embodiments, dimensions of first differential trace 410 and second differential trace 812, and spacings between first differential trace 410 and second differential trace 812 may be calculated to reduce impedance mismatch between first differential trace 410 and second differential trace 812. In some examples, one or more width and length of first differential trace 410, one or more width and length of second differential trace 812, first differential trace pair spacing 514a between first differential trace 410 and second differential trace 812, and second differential trace pair spacing 820 between first differential trace 410 and second differential trace 812 may be calculated to reduce impedance mismatch between first differential trace 410 and second differential trace 812. In some examples, degree angle 822 of second differential trace 812 routing or forming away from and degree angle 824 routing or forming towards first differential trace 410 may be calculated to reduce impedance mismatch between first differential trace 410 and second differential trace 812 as well as a crosstalk between second differential trace 812 and one or more adjacent traces (e.g. adjacent trace 415). In some examples, the transition point from second section 804 to third section 806 of second differential trace 812 may be configured to have a soft turn and/or bending structure to avoid data transmission distortion due to sharp angle change from second section 804 to third section 806 in second differential trace 812. In some examples, the widths and lengths of second section 804 and third section 806 may be calculated to minimize the impedance mismatch between first differential trace 410 and second differential trace 812 as well as the crosstalk between second differential trace 812 and adjacent trace 415, while adding pre-determined length to second differential trace 812. In some examples, the length of second section 804 and third section 806 in each serpentine structure 816 may be based on the total length difference between first differential trace 410 and second differential trace 812, the speed of data transmission, and/or the like. In some examples, the ratio of width 513a or 513b to width 810 may be calculated to minimize the impedance mismatch between first differential trace 410 and second differential trace 812 as well as the crosstalk between second differential trace 812 and one or more adjacent traces (e.g. adjacent trace 415). As illustrated in FIG. 8, a width of the second section 804 of the second differential trace 812 increases as the second section 804 transitions away from the first differential trace 410. Similarly, a width of the third section 806 of the second differential trace 812 decreases as the third section 806 transitions towards the first differential trace 410. In some examples, with speed of data transmission at 56 Gbps over differential trace pair 508 (FIG. 5) with serpentine structure 816, second width 810 of second differential trace 812 maybe up to a range from 1.1 to 2 times of first differential width 513a of second differential trace 812. For example, in an experimental embodiment of differential trace pair 508 and differential trace pair 508 discussed herein with reference to FIGS. 5 and 8, differential trace pair 508 provided by first differential trace pair spacing 514a produces a first impedance of 85 ohms, while differential trace pair 508 provided by second differential trace pair spacing 820 produces a second impedance of 87 ohms. As discussed above, this impedance mismatch at signal speeds above 25 Gbps will result in reflections, return losses, insertion losses, and/or a variety of other issues that result in degradation of the Bit Error Rate (BER) and Eye Diagram, and that reduce the margin for detecting errors in data transmission and reception which are discussed in detail in FIGS. 10-13B.

As discussed herein, the methods and systems of the present disclosure provide a differential trace pair that includes serpentine region(s) that provide a first impedance when the differential trace pair is at the first differential trace pair spacing, and a second impedance when the differential trace pair is at the increased second differential trace pair spacing, and that second impedance is the same as, matches, or is otherwise substantially similar to (e.g., within 2%) the first impedance in order to eliminate, reduce, or otherwise minimize impedance discontinuities that can result in losses such as, for example, return losses, insertion loss, and/or other losses that would be apparent to one of skill in the art in possession of the present disclosure.

Figure 9:
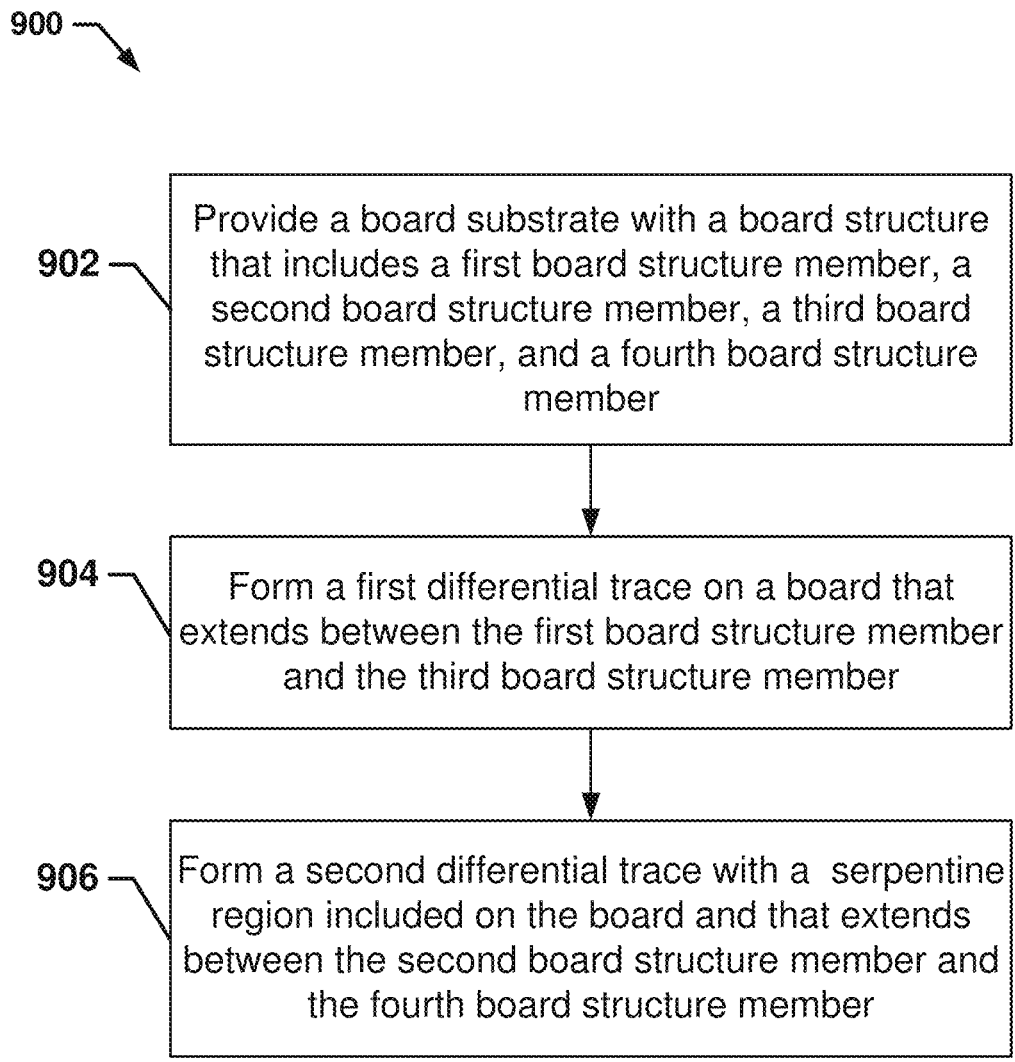
FIG. 9 is a flow chart illustrating an embodiment of a method for providing a differential trace pair.

Referring now to FIG. 9, an embodiment of a method 900 for providing a differential trace pair 508 (FIG. 5) is illustrated, according to some embodiments. In accordance with some embodiments, method 900 is consistent with FIGS. 5, 6B, 7B, and 8. As detailed herein, the systems and methods of the present disclosure provide differential trace pairs with serpentine regions with serpentine structures that minimize impedance discontinuities and a crosstalk that are otherwise present in other differential trace pairs serpentine regions used to compensate for trace length mismatch between board elements. In some embodiments, an angular routing may be used in the serpentine region to minimize the spacing discontinuity or gap between the differential trace pairs. In angular routing, a shorter differential trace is transitioned away to a calculated distance from a shorter differential trace and transitioned back to the shorter differential trace without maintaining the wider distance between the differential trace pairs. In some embodiments, a tapered transmission line may be used in to increase the shorter differential trace width in the angular transitioned sections of the shorter differential trace where the spacing between the differential trace pairs is increased. Tapering technique may be implemented on the shorter differential trace so that a first width of the shorter differential trace is gradually increased to a second width, thereby reducing the gap between the differential trace pairs. In this technique, the first width of the shorter differential trace section that is transitioning away from the longer differential trace is gradually increased up to the second width and the second width of the shorter differential trace section that is transitioning back to the longer differential trace is gradually decreased to the first width of the shorter differential pair, thereby reducing the difference between spacings and impedance mismatches of the differential traces.

The method 900 begins at a block 902 where a board substrate having a board structure is provided, such as, for example, the board 402 includes board structure 404 with reference to FIG. 5, which may be provided by the board structure 300 discussed above with reference to FIGS. 3A and 3B. As discussed above, the board structure 404 may include a plurality of board structure members 406 including first board structure member 406a, second board structure member 406b, third board structure member 406c, and fourth board structure member 406d with reference to FIG. 5. As would be understood by one of skill in the art in possession of the present disclosure, the board 402 may be provided in a variety of board manufacturing and/or trace routing systems known in the art.

The method 900 then proceeds to a block 904 where at least a portion of first differential trace 410 of differential trace pair 508 is defined on board 402 and extends between first board structure member 406a and third board structure member 406c. In some examples, first differential trace 410 may be defined, created, formed, etched, and/or otherwise provided by etching and masking techniques such as photoengraving, PCB milling, silk-screen printing, and/or other trace formation techniques known in the art. As discussed above, first differential trace 410 may electrically couple first board structure member 406a to third board structure member 406c.

With reference to FIGS. 5, 6B, 7B, 8 and 9, the method 900 then proceeds to a block 906 where at least a portion of second differential trace 512 with one or more serpentine regions with serpentine structures, such as serpentine structures 516 or 816, are defined on board 402 and extend, for example, between second board structure member 406b and fourth board structure member 406d. According to embodiments of the present disclosure, unlike the structures formed according to other techniques, serpentine structure 516 or 816 do not have substantial sections of the second differential trace that run parallel with the first differential trace at the greater width or spacing. Instead, each section of the second differential trace that transitions away from the first differential trace is followed immediately by a section of the second differential trace that transitions toward the first differential trace. In other words, the transition sections of the second differential trace are continuous, contiguous, or adjacent. With this arrangement or structure, impedance discontinuities between the differential trace pair and a crosstalk between the second differential pair with the serpentine structure and one or more adjacent traces that are otherwise present in other differential trace pairs serpentine regions, are reduced.

In some embodiments, at block 906 and with reference to FIGS. 5, 6B, 7B, 8, and 9, second differential trace 512 of differential trace pair 508 is added to board 402. In some examples, second differential trace 512 may be defined, created, formed, etched, and/or otherwise provided by etching and masking techniques such as photoengraving, PCB milling, silk-screen printing, and/or other trace formation techniques known in the art. As discussed above, second differential trace 512 may electrically couple second board structure member 406b to fourth board structure member 406d and includes a portion that defines the second differential trace 512 with trace widths such as trace widths 513a, 513b, and/or 810.

As would be understood by one of skill in the art in possession of the present disclosure, in some embodiments, the steps of blocks 904 and 906 may occur substantially simultaneously with either or both of the defining of the first differential trace at block 904 and the defining or forming of the second differential trace at block 906, and how that combination occurs will depend on the desired features of the serpentine region. Thereby, serpentine structure 516 may be defined, created, formed, etched, and/or otherwise provided by techniques such as photoengraving, PCB milling, silk-screen printing, and/or other trace formation techniques known in the art. With reference to FIGS. 6B and 8, one of skill in the art will appreciate that each of the serpentine structures 516 and 816 that operate to increase the length of one of the traces relative to the other in the differential trace pair may be configured in a similar manner while remaining within the scope of the present disclosure.

Referring now to FIGS. 10, 11, 12, 13A, and 13B, graphs 1000, 1100, 1200, 1300a, and 1300b are respectively provided to illustrate some of the benefits of the systems and methods of the present disclosure. In an experimental embodiment, consistent with FIGS. 1, 2, 3A, 3B, 4, 5, 6A, 6B, 7A, 7B, and 8, differential trace pair 408 of FIG. 4 with serpentine structure 416 of FIG. 4 and differential trace pair 508 of FIG. 5 with serpentine structure 516 of FIG. 5 or serpentine structure 816 of FIG. 8 are simulated.

Figure 10:
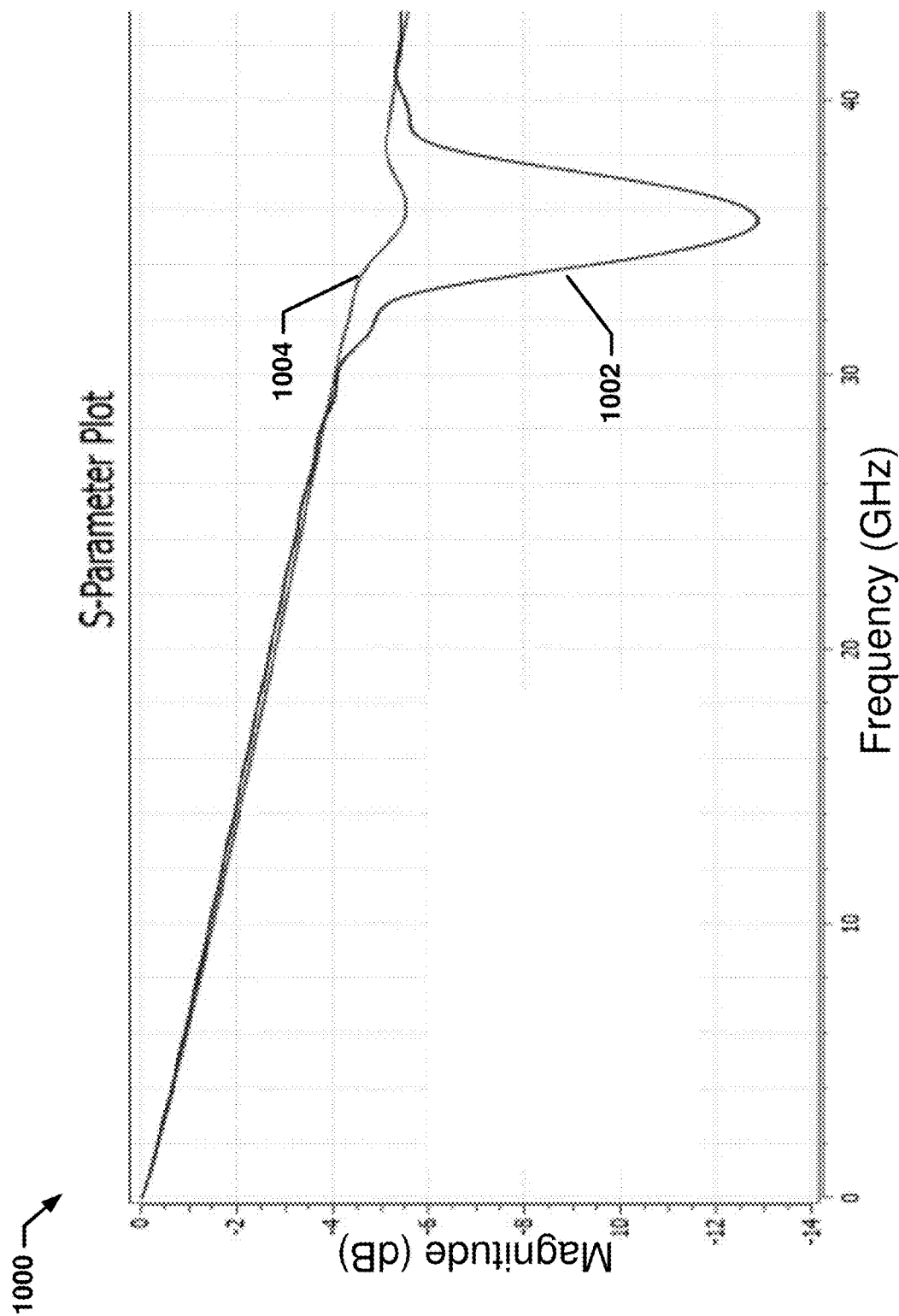
FIG. 10 is a graph illustrating an embodiment of insertion losses that may be introduced due to serpentine regions of the differential trace pairs of FIG. 4 compared to serpentine regions of the differential trace pairs of FIG. 5.

As shown in FIG. 10, a graph 1000 (titled "S-Parameter Plot") plots insertion loss 1004 (Frequency (GHz) versus Magnitude (dB)) between a transmitter and a receiver using differential trace pair 508 of FIG. 5 with a plurality of serpentine regions with serpentine structure 516 of FIG. 5 that are used to provide a differential routing from the transmitter to the receiver. The graph 1000 also plots insertion loss 1002 between the transmitter and the receiver using differential trace pair 408 with a plurality of serpentine structure 416 with reference to FIG. 4. In the vicinity of the resonance frequency of serpentine structures 416 and 816, insertion loss 1004 caused by serpentine structure 816 are at least 10 dB higher than insertion loss 1002 caused by serpentine structure 416.

Figure 11:
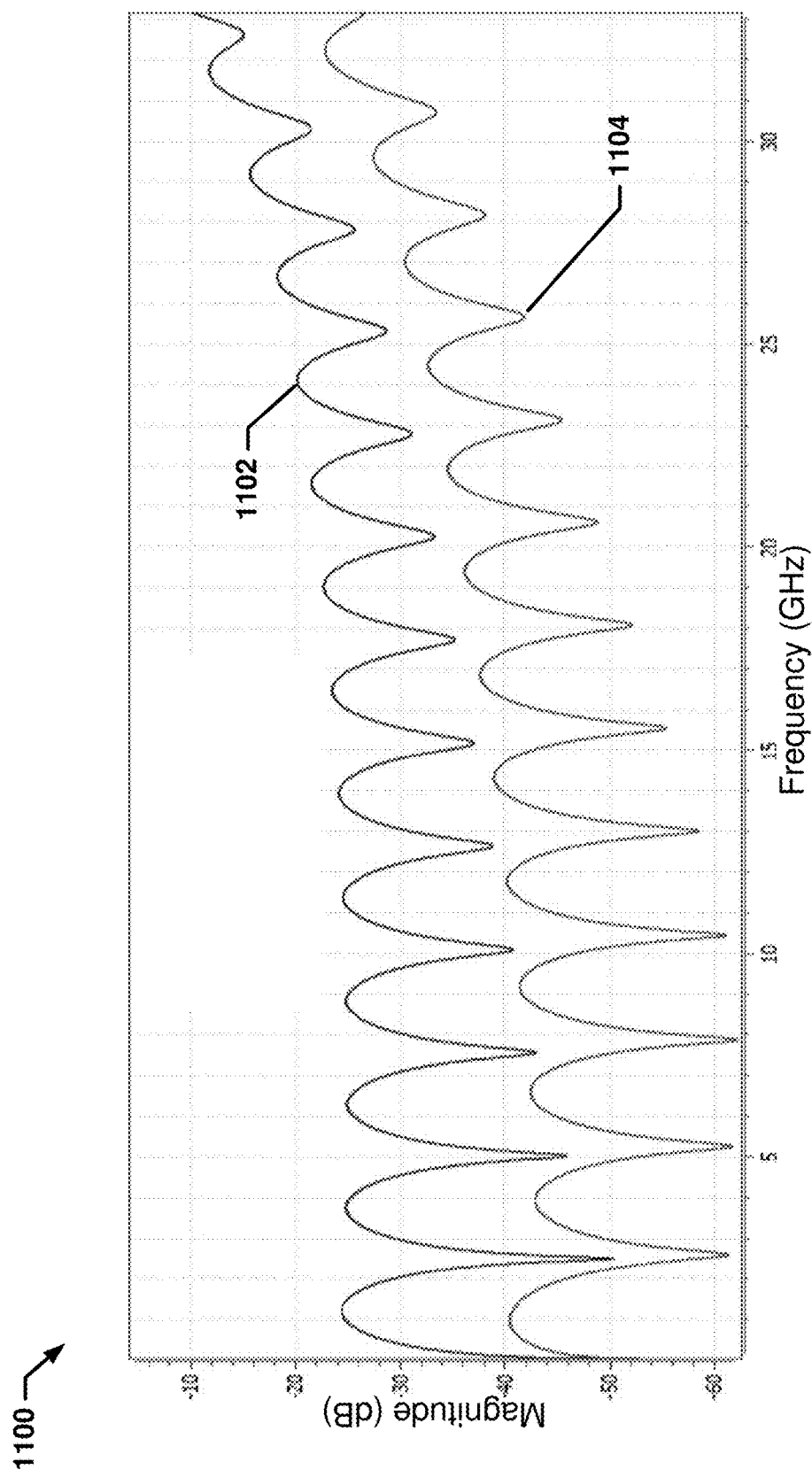
FIG. 11 is a graph illustrating an embodiment of return losses that may be introduced due to serpentine regions of the differential trace pairs of FIG. 4 compared to serpentine regions of the differential trace pairs of FIG. 5.

As shown in FIG. 11, a graph 1100 plots return loss 1104 (Frequency (GHz) versus Magnitude (dB)) between the transmitter and the receiver using differential trace pair 508 of FIG. 5 with serpentine structure 516 of FIG. 5. Graph 1100 also plots return loss 1102 between the transmitter and the receiver using differential trace pair 408 with serpentine structure 416 with reference to FIG. 4. Return loss 1104 caused by serpentine structure 816 over the frequency range illustrated in FIG. 11 are reduced at least by 15 dB, compared to return loss 1102 caused by serpentine structure 416.

Figure 12:
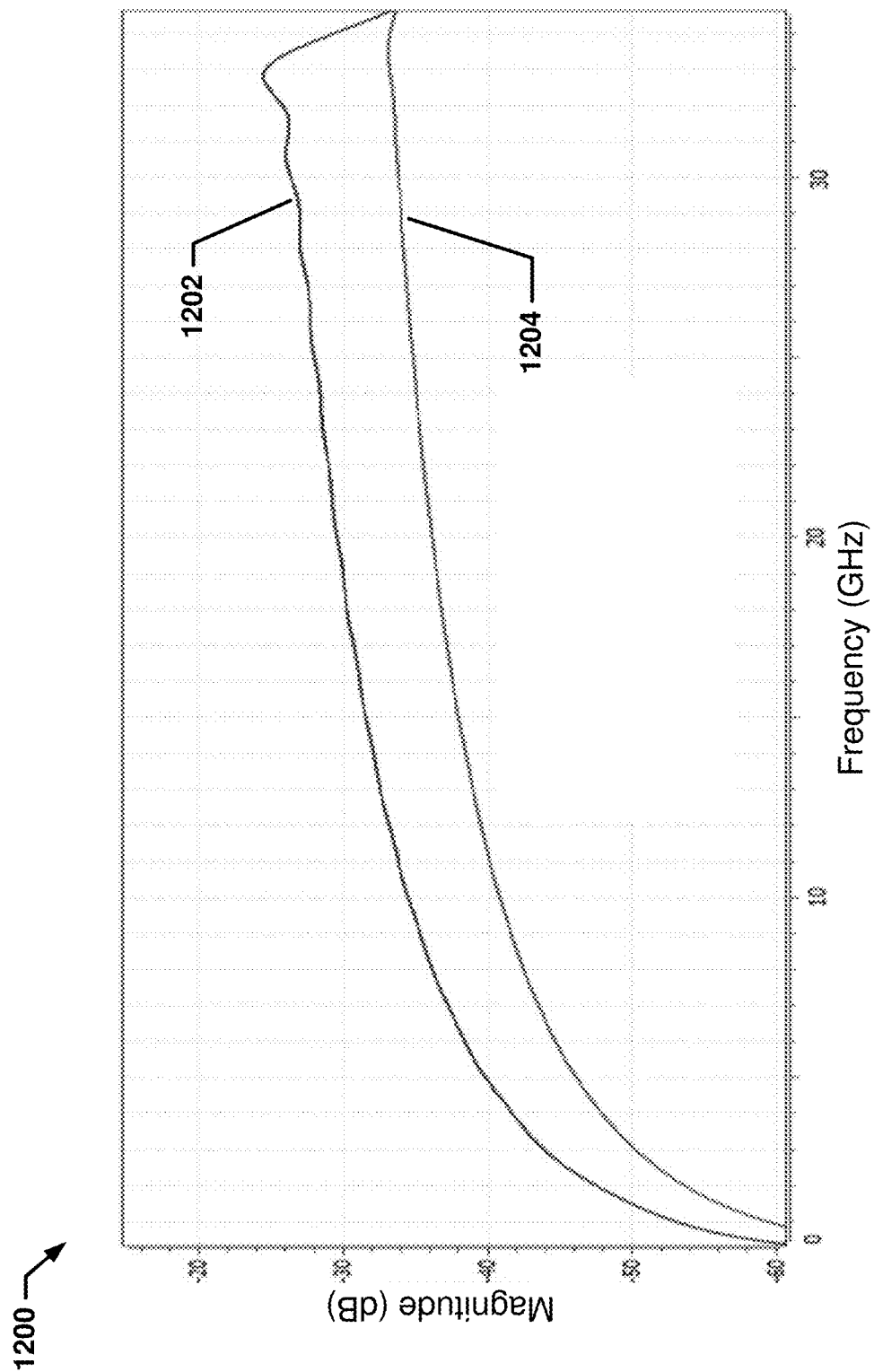
FIG. 12 is a graph illustrating an embodiment of a crosstalk that may be introduced due to serpentine regions of the differential trace pairs of FIG. 4 compared to serpentine regions of the differential trace pairs of 5.

As shown in FIG. 12, a graph 1200 plots a crosstalk 1204 (Frequency (GHz) versus Magnitude (dB)) between differential trace pair 508 of FIG. 5 with serpentine structure 516 of FIG. 5 and adjacent trace 415 with reference to FIG. 5. The graph 1200 also plots crosstalk 1202 between differential trace pair 408 with serpentine structure 416 and adjacent trace 415 with reference to FIG. 4. Crosstalk 1204 caused by serpentine structure 816 over the frequency range illustrated in FIG. 12 is reduced at least by 15 dB compared to a crosstalk 1202 caused by a serpentine region with serpentine structure 416.

Figure 13A:
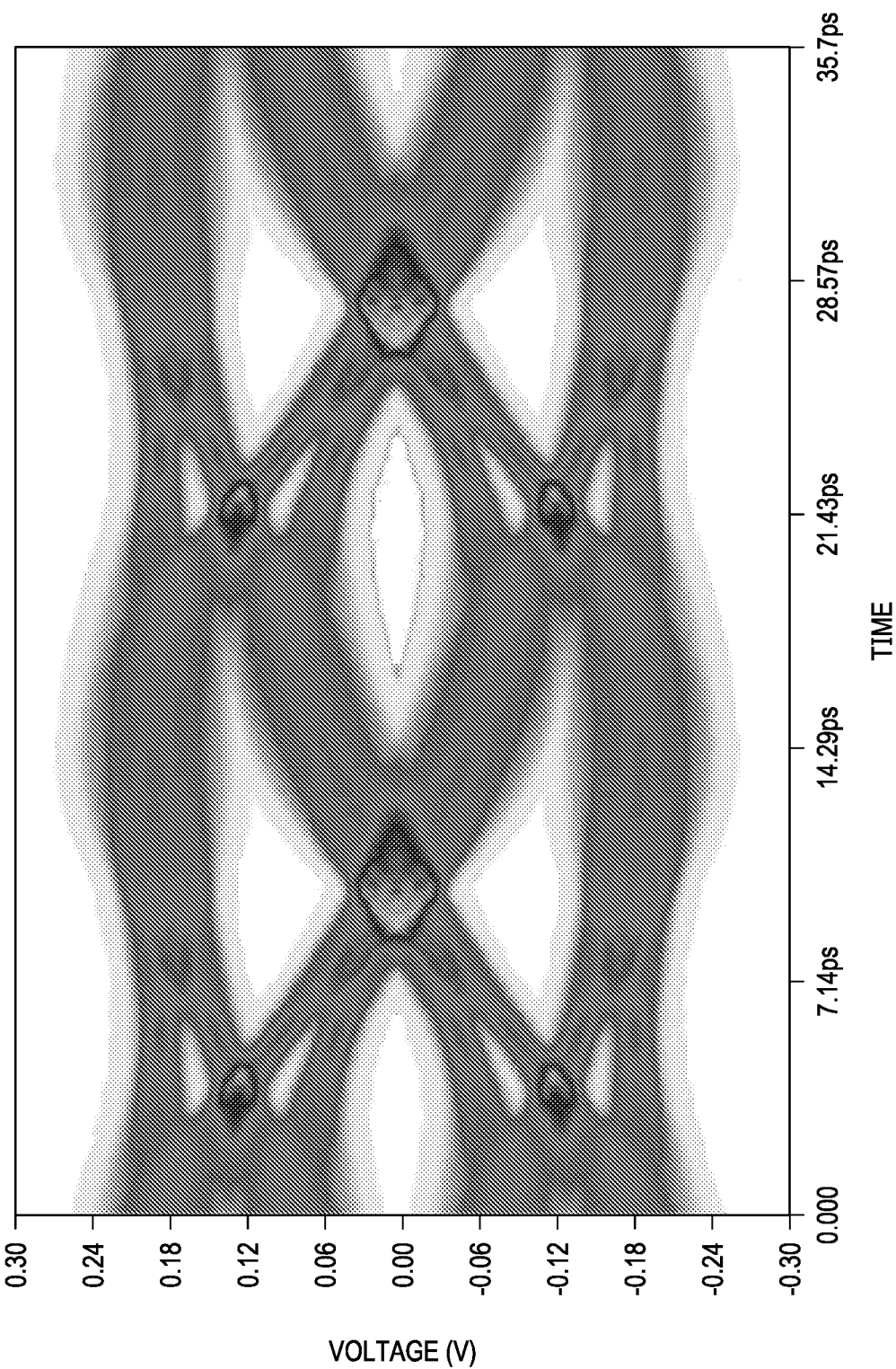
FIG. 13A is a graph illustrating an embodiment of eye diagram of a time domain simulation for a serpentine region in a differential trace pair of FIG. 4.
Figure 13B:
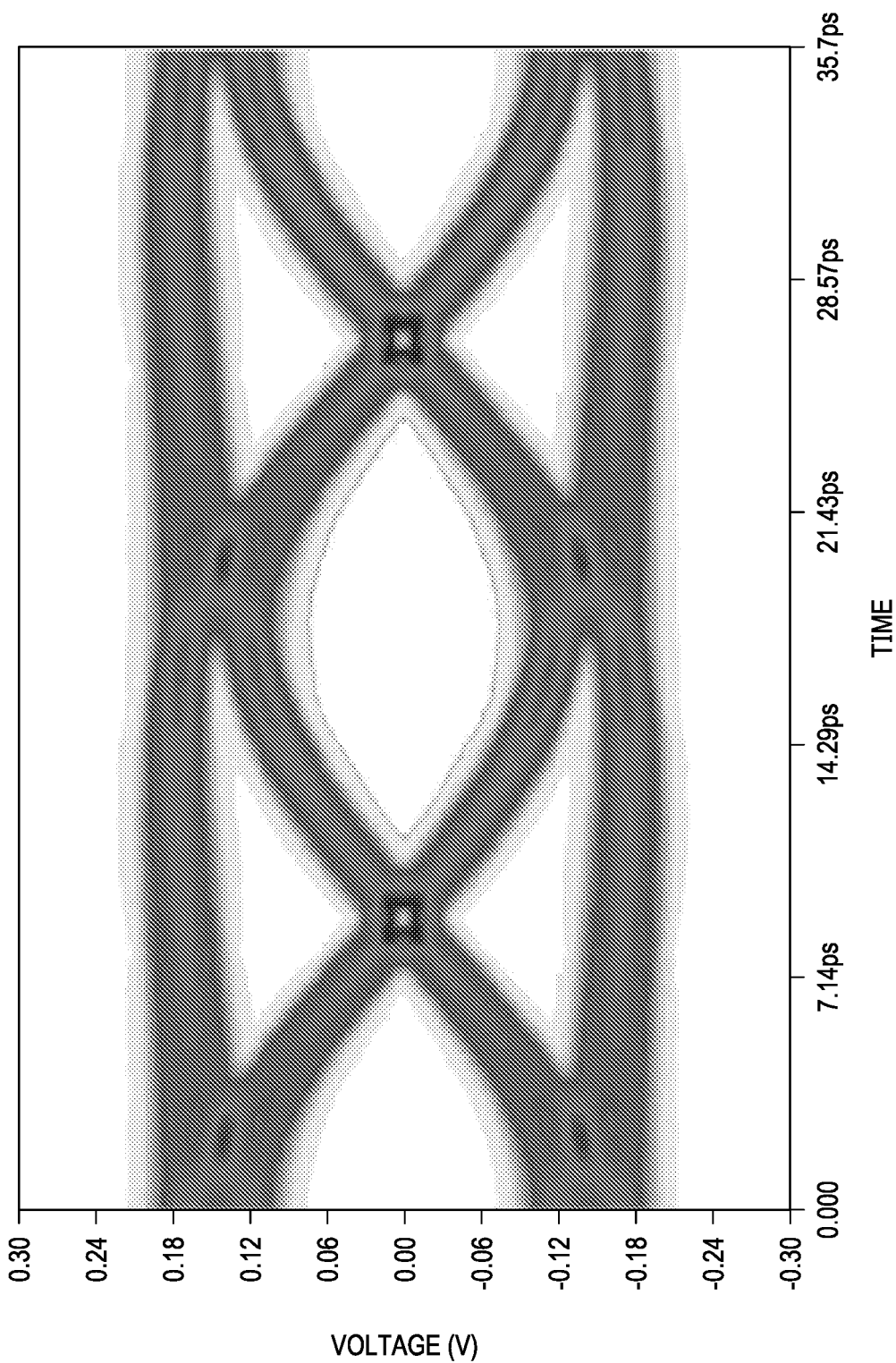
FIG. 13B is a graph illustrating an embodiment of eye diagram of a time domain simulation for a serpentine region in a differential trace pair of FIG. 5.

As shown in FIGS. 13A and 13B, an eye diagram 1300a (plotted Time (ps) versus Voltage (V)) is illustrated in FIG. 13A to illustrate a time domain simulation of differential trace pair 408 with serpentine structure 416 with reference to FIGS. 4 and 6A. During the time domain simulation, the transmitter was transmitting at 56 Gbps over differential trace pair 408 of FIG. 4. The time domain simulation resulted in an eye width of 7.7 ps and an eye height of 39.00 mV. Similarly, an eye diagram 1300b is shown in FIG. 13B (plotted Time (ps) versus Voltage (V)) to illustrate a time domain simulation of the serpentine structure 516 with reference to FIGS. 5 and 6B. During the time domain simulation, the transmitter is transmitting at 56 Gbps over differential trace pair 408 with serpentine structure 416. The time domain simulation resulted in an eye width of 13 ps and an eye height of 147.6 mV. Thus, the experimental serpentine structure 516 of FIG. 5 or 816 of FIG. 8 provided over a 350% improvement in the eye of the eye diagram when compared to eye diagram generated using serpentine structure 416 of FIG. 4.

Thus, systems and methods for providing differential trace pairs have been described that provide serpentine regions that minimize a crosstalk and impedance discontinuities that are otherwise present in other differential trace pair serpentine regions that are provided to compensate for trace length mismatch between connectors, where differential traces have different lengths. Such benefits are realized by an angular tracing on a shorter differential trace in the differential trace pair serpentine regions, where the shorter differential trace is transitioned away from the longer differential trace to a point and transitioned back to the longer differential trace. In some embodiments, the shorter differential trace may be tapered to have a wider width in the serpentine region of the differential trace pair where the traces are spaced further apart from each other, thereby, further minimizing the spacing difference and impedance mismatches between differential trace pairs. As such, differential trace pairs may be routed to connect to transmitters and/or receivers using serpentine trace length mismatch compensation without an impedance mismatch that increases reflections and/or losses at higher transmission rates.

Although illustrative embodiments have been shown and described, a wide range of modification, change, and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A differential trace pair system, comprising:
   a processor;
   a board including a board structure that couples the processor to the board, wherein the board structure includes a first board structure member, a second board structure member, a third board structure member, and a fourth board structure member, wherein a distance between the first board structure member and the third board structure member is longer than a distance between the second board structure member and the fourth board structure member; and
   a differential trace pair that is provided in the board and that includes:
      a first differential trace extending between the first board structure member and the third board structure member and having a first width; and
      a second differential trace extending between the second board structure member and the fourth board structure member, the second differential trace having a serpentine structure that includes:
         a first portion of the second differential trace that is substantially parallel with a paired first portion of the first differential trace and that has the first width;
         a second portion of the second differential trace that is contiguous with the first portion of the second differential trace and that transitions away from the first differential trace and the first portion of the second differential trace, wherein the second portion has at least one second width that is greater than the first width of a paired second portion of the first differential trace that is not parallel with the second portion; and a third portion of the second differential trace that is contiguous with the second portion of the second differential trace and that transitions away from the second portion of the second differential trace towards the first differential trace and a fourth portion of the second differential trace that is substantially parallel with a paired fourth portion of the first differential trace, that has the first width, and that is contiguous with the third portion, wherein the third portion has the at least one second width that is greater than the first width of a paired third portion of the first differential trace that is not parallel with the third portion of the second differential trace.

2. The differential trace pair system of claim 1, wherein the at least one second width of the second portion of the second differential trace increases as the second portion transitions away from the first differential trace and the first portion of the second differential trace, wherein the at least one second width of the third portion of the second differential trace decreases as the second portion transitions away from the second portion of the second differential trace towards the first differential trace and the fourth portion of the second differential trace.

3. The differential trace pair system of claim 1, wherein the first differential trace and the second portion of the second differential trace form an increasing spacing therebetween as the second portion of the second differential trace transitions away from the first differential trace and the first portion of the second differential trace and the first differential trace and the third portion of the second differential trace form a decreasing spacing therebetween as the third portion of the second differential trace transitions away from the second portion of the second differential trace toward the first differential trace and the fourth portion of the second differential trace.

4. The differential trace pair system of claim 1, wherein the second portion of the second differential trace and the third portion of the second differential trace have substantially the same length.

5. The differential trace pair system of claim 1, wherein the second differential trace is configured to include one or more of the serpentine structure so that the first and second differential traces have substantially the same length.

6. The differential trace pair system of claim 1, wherein the second portion of the second differential trace has the first width at a first end that is contiguous with the first portion and the at least one second width that is greater than the first width at a second end that is contiguous with the third portion, wherein the third portion of the second differential trace has the at least one second width at a first end that is contiguous with the second portion of the second differential trace and the first width at a second end of the third portion that is contiguous with the fourth portion, and a ratio of the at least one second width to the first width is up to a range from 1.1 to 2.

7. The differential trace pair system of claim 1, wherein the serpentine structure is configured to reduce impedance mismatches between the first differential trace and the second differential trace, and a crosstalk between the second differential trace and one or more adjacent traces.

8. An information handling system (IHS), comprising:
a processor;
a circuit board having a connection pad array that couples the processor to the circuit board, wherein the connection pad array includes a first connection pad, a second connection pad, a third connection pad, and a fourth connection pad;
a differential trace pair that is provided in the circuit board and that includes:
a first differential trace extending between the first connection pad and the third connection pad and having a first width; and
a second differential trace extending between the second connection pad and the fourth connection pad, the second differential trace having a serpentine structure that includes:
a first portion of the second differential trace that is substantially parallel with a paired first portion of the first differential trace and that has the first width;
a second portion of the second differential trace that is contiguous with the first portion of the second differential trace and that transitions away from the first differential trace and the first portion of the second differential trace, wherein the second portion has at least one second width that is greater than the first width of a paired second portion of the first differential trace that is not parallel with the second portion; and
a third portion of the second differential trace that is contiguous with the second portion of the second differential trace and that transitions away from the second portion of the second differential trace towards the first differential trace and a fourth portion of the second differential trace that is substantially parallel with a paired fourth portion of the first differential trace, that has the first width, and that is contiguous with the third portion, wherein the third portion has the at least one second width that is greater than the first width of a paired third portion of the first differential trace that is not parallel with the third portion of the second differential trace.

9. The IHS of claim 8, wherein the at least one second width of the second portion of the second differential trace increases as the second portion transitions away from the first differential trace and the first portion of the second differential trace, wherein the at least one second width of the third portion of the second differential trace decreases as the second portion transitions away from the second portion of the second differential trace towards the first differential trace and the fourth portion of the second differential trace.

10. The IHS of claim 8, wherein the first differential trace and the second portion of the second differential trace form an increasing spacing therebetween as the second portion of the second differential trace transitions away from the first differential trace and the first portion of the second differential trace and the first differential trace and the third portion of the second differential trace form a decreasing spacing therebetween as the third portion of the second differential trace transitions away from the second portion of the second differential trace toward the first differential trace and the fourth portion of the second differential trace.

11. The IHS of claim 8, wherein the second portion of the second differential trace and the third portion of the second differential trace have substantially the same length.

12. The IHS of claim 8, wherein a distance between the first connection pad and the third connection pad is longer than a distance between the second connection pad and the fourth connection pad, and wherein the second differential trace is configured to include one or more of the serpentine structure so that the first and second differential traces have substantially the same length.

13. The IHS of claim 8, wherein the second portion of the second differential trace has the first width at a first end that is contiguous with the first portion and the at least one second width that is greater than the first width at a second end that is contiguous with the third portion, wherein the third portion of the second differential trace has the at least one second width at a first end that is contiguous with the second portion of the second differential trace and the first width at a second end of the third portion that is contiguous with the fourth portion, and a ratio of the at least one second width to the first width is up to a range from 1.1 to 2.

14. The IHS of claim 8, wherein the serpentine structure is configured to reduce impedance mismatches between the first differential trace and the second differential trace, and a crosstalk between the second differential trace and one or more adjacent traces.

15. A method for forming a differential trace pair on a board, the method comprising:
providing the board as to include a board structure that couples a processor to the board, wherein the board structure includes a first board structure member, a second board structure member, a third board structure member, and a fourth board structure member, wherein a distance between the first board structure member and the third board structure member is longer than a distance between the second board structure member and the fourth board structure member;
forming a first differential trace extending between the first board structure member and the third board structure member and having a first width; and
forming a second differential trace extending between the second board structure member and the fourth board structure member,
wherein forming the second differential trace includes:
forming a first portion of the second differential trace that is substantially parallel with a paired first portion of the first differential trace and that has the first width;
forming a second portion of the second differential trace that is contiguous with the first portion of the second differential trace and that transitions away from the first differential trace and the first portion of the second differential trace, wherein the second portion has at least one second width that is greater than the first width of a paired second portion of the first differential trace that is not parallel with the second portion; and
forming a third portion of the second differential trace that is contiguous with the second portion of the second differential trace and that transitions away from the second portion of the second differential trace towards the first differential trace, wherein the third portion has the at least one second width that is greater than the first width of a paired third portion of the first differential trace that is not parallel with the third portion of the second differential trace; and
forming a fourth portion of the second differential trace that is substantially parallel with a paired fourth portion of the first differential trace, that has the first width, and that is contiguous with the third portion.

16. The method of claim 15, wherein the at least one second width of the second portion of the second differential trace increases as the second portion transitions away from the first differential trace and the first portion of the second differential trace, wherein the at least one second width of the third portion of the second differential trace decreases as the second portion transitions away from the second portion of the second differential trace towards the first differential trace and the fourth portion of the second differential trace.

17. The method of claim 15, wherein the first differential trace and the second portion of the second differential trace form an increasing spacing therebetween as the second portion of the second differential trace transitions away from the first differential trace and the first portion of the second differential trace and the first differential trace and the third portion of the second differential trace form a decreasing spacing therebetween as the third portion of the second differential trace transitions away from the second portion of the second differential trace toward the first differential trace and the fourth portion of the second differential trace.

18. The method of claim 15, wherein the second portion of the second differential trace and the third portion of the second differential trace have substantially the same length.

19. The method of claim 15, wherein the second portion of the second differential trace has the first width at a first end that is contiguous with the first portion and the at least one second width that is greater than the first width at a second end that is contiguous with the third portion, wherein the third portion of the second differential trace has the at least one second width at a first end that is contiguous with the second portion of the second differential trace and the first width at a second end of the third portion that is contiguous with the fourth portion, and a ratio of the at least one second width to the first width is up to a range from 1.1 to 2.

20. The method of claim 15, wherein the second differential trace is configured to reduce impedance mismatches between the first differential trace and the second differential trace, and a crosstalk between the second differential trace and one or more adjacent traces.

* * * * *